(12) United States Patent
Bowen et al.

(10) Patent No.: US 11,791,104 B2
(45) Date of Patent: Oct. 17, 2023

(54) REDUCING VARIANCE IN CAPACITOR ELECTRODES

(71) Applicant: Pacesetter, Inc., Sylmar, CA (US)

(72) Inventors: David Bowen, Taylors, SC (US); Ralph Jason Hemphill, Sunset, SC (US)

(73) Assignee: Pacesetter, Inc., Sylmar, CA (US)

( * ) Notice: Subject to any disclaimer, the term of this patent is extended or adjusted under 35 U.S.C. 154(b) by 141 days.

(21) Appl. No.: 16/888,650

(22) Filed: May 29, 2020

(65) Prior Publication Data
US 2021/0375554 A1 Dec. 2, 2021

(51) Int. Cl.
| | |
|---|---|
| H01G 9/00 | (2006.01) |
| H01G 9/04 | (2006.01) |
| C25F 3/02 | (2006.01) |
| C25D 11/20 | (2006.01) |
| C25D 11/24 | (2006.01) |
| G01R 27/26 | (2006.01) |
| C25D 11/12 | (2006.01) |
| H01G 9/045 | (2006.01) |

(52) U.S. Cl.
CPC ........... *H01G 9/0032* (2013.01); *C25D 11/12* (2013.01); *C25D 11/20* (2013.01); *C25D 11/24* (2013.01); *C25F 3/02* (2013.01); *G01R 27/26* (2013.01); *H01G 9/04* (2013.01); *H01G 9/045* (2013.01)

(58) Field of Classification Search
None
See application file for complete search history.

(56) References Cited

U.S. PATENT DOCUMENTS

| | | | | |
|---|---|---|---|---|
| 4,487,666 | A * | 12/1984 | Bates | C25D 11/26 205/82 |
| 6,299,752 | B1 * | 10/2001 | Strange | H01G 9/0032 205/213 |
| 9,842,702 | B1 * | 12/2017 | Bowen | H01G 9/0029 |
| 2006/0191796 | A1 * | 8/2006 | Muffoletto | C25D 11/26 205/102 |

* cited by examiner

*Primary Examiner* — Louis J Rufo

(57) ABSTRACT

Fabricating an electrode for capacitor includes performing a first set of one or more preliminary oxide formation operations on a sheet of material. The method also includes performing a capacitance test on the sheet of material so as to determine the capacitance of the sheet of material after the one or more preliminary oxide formation operations. The method proceeds on a first path in response to a first result of the capacitance test and on a second path in response to a second result of the capacitance test. The first path includes performing a second set of the one or more preliminary oxide formation operations on the sheet of material so as to reduce the capacitance of the sheet of material below the determined capacitance. The second path excludes performing any preliminary oxide formation operations on the sheet of material.

17 Claims, 10 Drawing Sheets

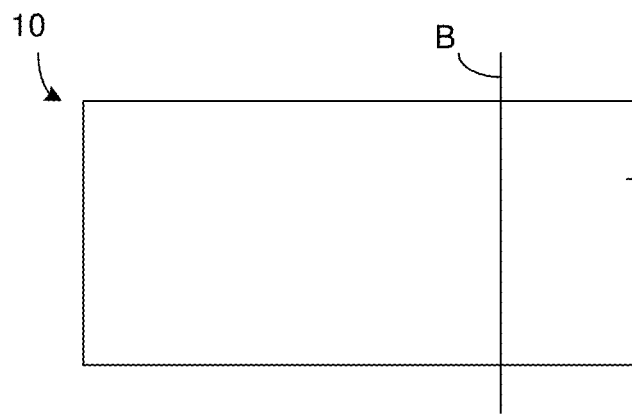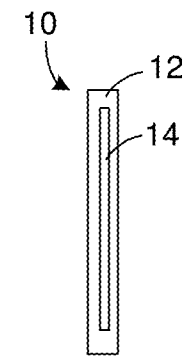
Figure 1A  Figure 1B
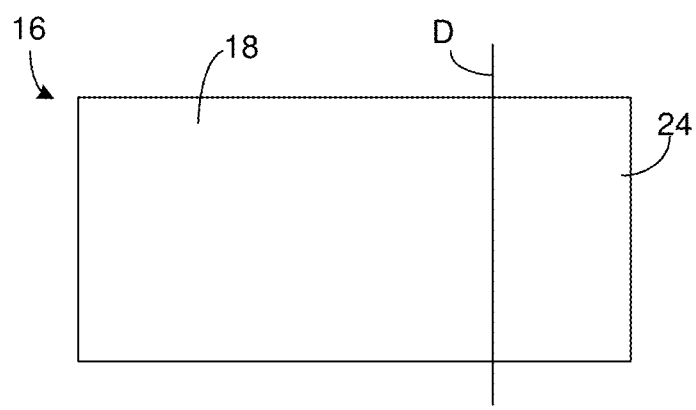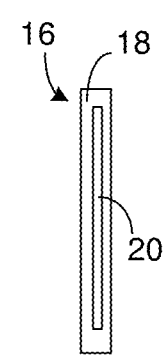
Figure 1C  Figure 1D
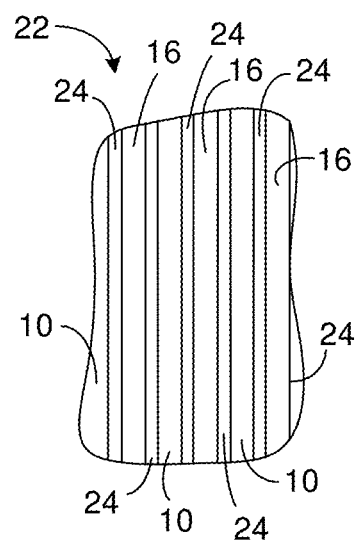
Figure 1E

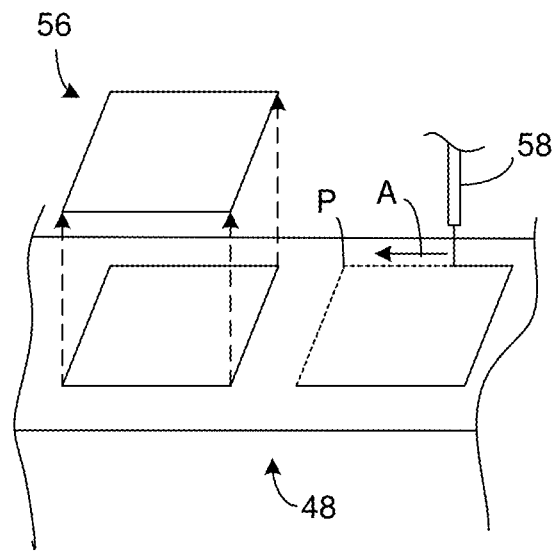
Figure 2G
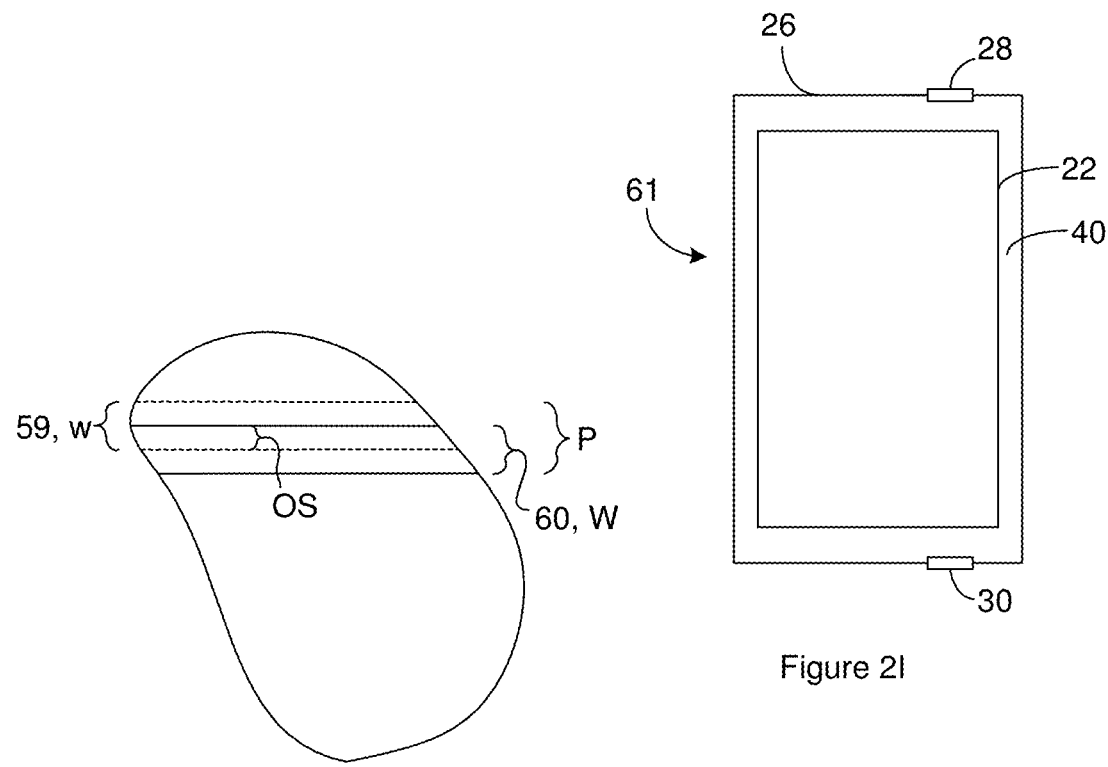
Figure 2H
Figure 2I

REDUCING VARIANCE IN CAPACITOR ELECTRODES

FIELD

The invention relates to electrochemical devices. In particular, the invention relates to electrodes in capacitors.

BACKGROUND

Capacitors are used in a variety of applications such as implantable cardioverter defibrillators (ICDs). In many of these applications, it is desirable to increase the capacitance per unit volume of the capacitor. Since the capacitance of an electrolytic capacitor increases with the surface area of its electrodes, increasing the surface area of the aluminum anode foil results in increased capacitance per unit volume of the capacitor. One method of increasing the surface area of the electrodes is to form channels in the electrodes, widening the channels and forming an oxide on the electrode. However, current methods of forming these channels result in an undesirably high level of variation in the capacitance of the resulting electrodes. Efforts to address this variance in electrode capacitance are often, complex, timely, and expensive.

For the above reasons, there is a need for improved capacitor electrodes.

SUMMARY

Fabricating an electrode for capacitor includes performing a first set of one or more preliminary oxide formation operations on a sheet of material. The method also includes performing a capacitance test on the sheet of material so as to determine the capacitance of the sheet of material after the one or more preliminary oxide formation operations. The method proceeds on a first path in response to a first result of the capacitance test and on a second path in response to a second result of the capacitance test. The first path includes performing a second set of the one or more preliminary oxide formation operations on the sheet of material so as to reduce the capacitance of the sheet of material below the determined capacitance. The second path excludes performing any preliminary oxide formation operations on the sheet of material.

BRIEF DESCRIPTION OF THE FIGURES

FIG. 1A through FIG. 1G illustrate the construction of a capacitor. FIG. 1A is a sideview of an anode that is suitable for use in the capacitor.

FIG. 1B is a cross-section of the anode shown in FIG. 1A taken along the line labeled B in FIG. 1A.

FIG. 1C is a sideview of a cathode that is suitable for use in the capacitor.

FIG. 1D is a cross-section of the cathode shown in FIG. 1C taken along the line labeled D in FIG. 1C.

FIG. 1E is a cross section of an electrode assembly where anodes are alternated with cathodes. The anodes and cathodes can be constructed according to FIG. 1A through FIG. 1D.

FIG. 1F is a schematic diagram of a capacitor that includes the electrode assembly of FIG. 1E positioned in a capacitor case.

FIG. 1G is a sideview of an interface between an anode and a cathode that are adjacent to one another in the capacitor of FIG. 1F.

FIG. 2A through FIG. 2I illustrate a method of generating an anode for use in a capacitor constructed according to FIG. 1A through FIG. 1G. FIG. 2A is a topview of a sheet of material from which the anode is constructed. The sheet of material can be a sheet of an anode metal.

FIG. 2B is a portion of a cross section of the sheet of material showing an interface between the side of the sheet of material and the atmosphere in which the sheet of material is positioned.

FIG. 2C illustrates the sheet of material of FIG. 2B after the formation of preliminary channels in the sheet of material.

FIG. 2D illustrates an electrochemical etch system that is suitable for performing an electrochemical etch or for performing a chemical etch and an electrochemical etch.

FIG. 2E illustrates the sheet of material of FIG. 2C after widening the preliminary channels.

FIG. 2F illustrates the sheet of material of FIG. 2C after formation of an anode metal oxide on the exposed surfaces of an anode metal.

FIG. 2G illustrate an anode extracted from the sheet of material shown in FIG. 2F.

FIG. 2H is a topview of a portion of a sheet of material having a laser pathway with multiple different tracks.

FIG. 2I illustrates a capacitor that includes the anode of FIG. 2H.

DESCRIPTION

Fabricating an electrode for a capacitor includes forming a layer of anode metal oxide on a sheet of material. Forming the layer of anode metal oxide includes performing a set of one or more preliminary oxide formation operations on the sheet of material followed by testing the sheet of material for capacitance. The path followed by the fabrication process changes in response to the results of the capacitance test. For instance, when the determined capacitance fails one or more capacitance criteria, the preliminary oxide formation operations are repeated on the sheet of material but with the preliminary oxide formation operations modified so as to lower the capacitance of the sheet of material below the determined capacitance. In contrast, when the determined capacitance satisfies the one or more capacitance criteria, the process of forming the layer of anode metal continues without the need for additional preliminary oxide formation operations. Accordingly, the modified oxide formation operations are not applied to a portion of the sheets of material. Applying modified preliminary oxide formation to a portion of the sheets of material moves their capacitance toward the capacitance of the sheets of material that did not receive the modified preliminary oxide formation operations. As a result, the variance in the capacitance for the sheets of material can be reduced. In some instances, the standard deviation is reduced by more than 45%. This reduction in the capacitance variance can reduce fabrication complexity while saving time and/or costs.

The oxide formation operations can be an anodic oxidation performed with the sheet of material in an electrolytic bath. In some instances, the oxide formation operations, the modified preliminary oxide formation operations, and the capacitance tests are all performed while the sheet of material is positioned in the same electrolytic bath. The ability to conduct a large portion of the anode metal oxide formation process without removing the sheet of metal from the bath further simplifies the process.

Figure 1F:
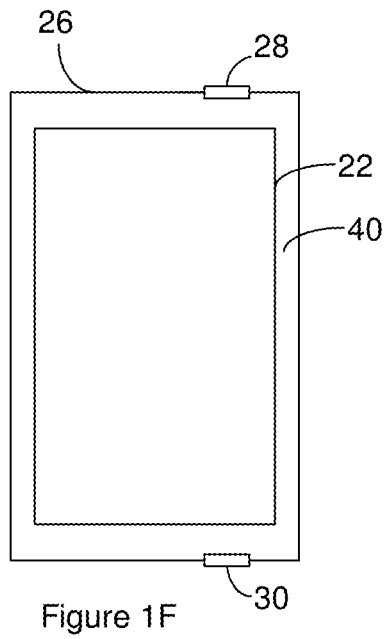

FIG. 1A through FIG. 1G illustrate the construction of a capacitor. FIG. 1A is a sideview of an anode 10 that is suitable for use in the capacitor. FIG. 1B is a cross-section of the anode 10 shown in FIG. 1A taken along the line labeled B in FIG. 1A. The anode 10 includes, consists of, or consists essentially of a layer of anode metal oxide 12 over a layer of an anode metal 14. Suitable anode metals 14 include, but are not limited to, aluminum, tantalum, magnesium, titanium, niobium, and zirconium. As illustrated in FIG. 1B, in some instances, the anode metal oxide 12 surrounds the anode metal 14 in that the anode metal oxide 12 is positioned on both the edges and the faces of the anode metal 14. Many anode metal oxides 12 can exist in more than one phase within the same material state (solid, liquid, gas, plasma). For instance, an anode metal oxide 12 such as aluminum oxide can be in a boehmite phase (AlO(OH)) that is a solid or in alpha phase corundum oxide phase ($\alpha$-$Al_2O_3$) that is also a solid.

FIG. 1C is a sideview of a cathode 16 that is suitable for use in the capacitor. FIG. 1D is a cross-section of the cathode 16 shown in FIG. 1C taken along the line labeled D in FIG. 1C. The cathode 16 includes a layer of cathode metal oxide 18 over a layer of a cathode metal 20. Suitable cathode metals 20 include, but are not limited to, aluminum, titanium, and stainless steel. Although not illustrated, the cathode metal can be layer of material on a substrate. For instance, the cathode metal can be a titanium or titanium nitride coating on a substrate such as a metal and/or electrically conducting substrate. Examples of suitable substrates include, but are not limited to, aluminum, titanium, and stainless steel substrates. The cathode metal oxide 18 can be formed on the cathode metal 20 by oxidizing the cathode metal 20 in air. The cathode metal 20 can be the same as the anode metal 14 or different from the anode metal 14. In some instances, the cathode metal 20 and the anode metal 14 are both aluminum. As illustrated in FIG. 1D, in some instances, the cathode metal oxide 18 surrounds the cathode metal 20. For instance, the cathode metal oxide 18 is positioned over the edges and faces of the cathode metal 20.

The anodes 10 and cathodes 16 are generally arranged in an electrode assembly 22 where one or more anodes 10 are alternated with one or more cathodes 16. For instance, FIG. 1E is a cross section of an electrode assembly 22 where anodes 10 are alternated with cathodes 16. The anodes 10 and cathodes 16 can be constructed according to FIG. 1A through FIG. 1D. A separator 24 is positioned between anodes 10 and cathodes 16 that are adjacent to one another in the electrode assembly 22. The electrode assembly 22 typically includes the anodes 10 and cathodes 16 arranged in a stack or in a jelly roll configuration. Accordingly, the cross section of FIG. 1E can be a cross section of an electrode assembly 22 having multiple anodes 10 and multiple cathodes 16 arranged in a stack. Alternately, the cross section of FIG. 1E can be created by winding one or more anodes 10 together with one or more cathodes 16 in a jelly roll configuration. However, as the anodes become more brittle due to increased surface area, it may not be practical or possible to form a jellyroll configuration. Suitable separators 24 include, but are not limited to, kraft paper, fabric gauze, and woven for non-woven textiles made of one or a composite of several classes of nonconductive fibers such as aramids, polyolefins, polyamides, polytetrafluoroethylenes, polypropylenes, and glasses.

The electrode assembly 22 is included in a capacitor. For instance, FIG. 1F is a schematic diagram of a capacitor that includes the electrode assembly 22 of FIG. 1E positioned in a capacitor case 26. Although not illustrated, the one or more anodes in the electrode assembly 22 are in electrical communication with a first terminal 28 that can be accessed from outside of the capacitor case 26. The one or more cathodes 16 in the electrical assembly are in electrical communication with a second terminal 30 that can be accessed from outside of the capacitor case 26. In some instances, the one or more anodes include or are connected to tabs (not shown) that provide electrical communication between the one or more anodes and the first terminal 28 and the one or more cathodes 16 include or are connected to tabs (not shown) that provide electrical communication between the one or more cathodes 16 and the second terminal 30. The capacitor can include one or more electrical insulators (not shown) positioned as needed to prevent shorts-circuits within the capacitor.

Figure 1G:
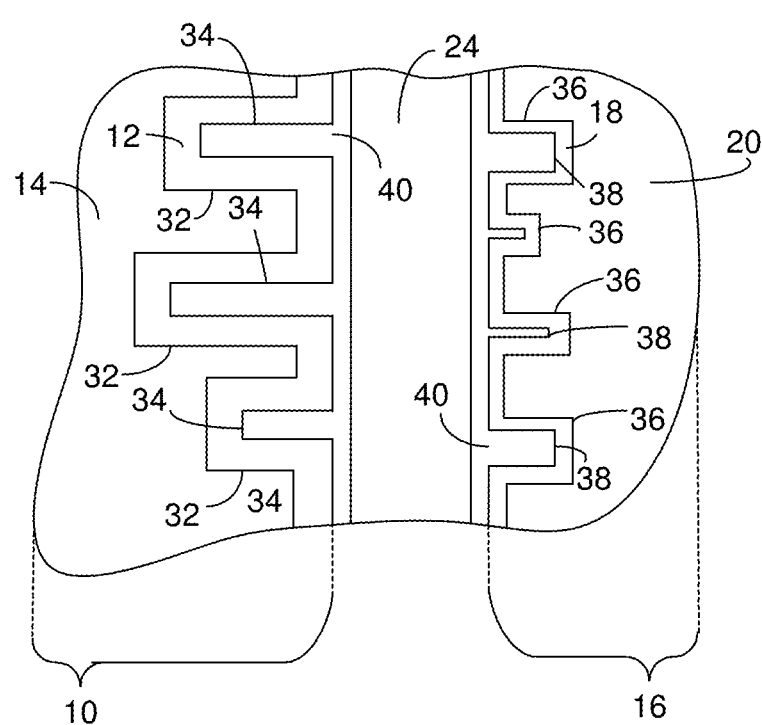

FIG. 1G is a sideview of an interface between an anode 10 and a cathode 16 that are adjacent to one another in the capacitor of FIG. 1F. The illustration in FIG. 1G is magnified so it shows features of the anode 10 and cathode 16 that are not shown in FIG. 1A through FIG. 1E. The face of the anode 10 includes channels 32 that extend into the anode metal 14 so as to increase the surface area of the anode metal 14. Although the channels 32 are shown extending part way into the anode metal, all or a portion of the channels 32 can extend through the anode metal. Suitable channels 32 include, but are not limited to, pores, trenches, tunnels, recesses, and openings. In some instances, the channels 32 are configured such that the anode has a number of channels/area greater than or equal to 30 million tunnels/$cm^2$. Increasing the number of channels has been shown to increase the brittleness of the anodes and/the sheet of material from which the anodes are extracted. Accordingly, increasing the surface area of the anode can result in a more brittle anode or sheet of material. The anode metal oxide 12 is positioned on the surface of the anode metal 14 and is positioned in the channels 32. The anode metal oxide 12 can fill the channels 32 and/or anode oxide channels 34 can extend into the anode metal oxide 12. However, it is generally not desirable for the anode metal oxide 12 to fill the channels 32 because filling the channels 32 can lead to reduced capacitance and electrical porosity.

The surface of the cathode 16 optionally includes cathode channels 36 that extend into the anode metal 14 so as to increase the surface area of the anode metal 14. Suitable cathode channels 36 include, but are not limited to, pores, trenches, tunnels, recesses, and openings. The cathode metal oxide 18 can be positioned on the surface of the cathode metal 20. When the cathode metal 20 includes cathode channels 36, the cathode metal oxide 18 can be positioned in the cathode channels 36. The cathode metal oxide 18 can fill the cathode channels 36 and/or cathode oxide channels 38 can extend into the cathode metal oxide 18.

An electrolyte 40 is in contact with the separator 24, the anode 10 and the cathode 16. The electrolyte 40 can be positioned in the cathode oxide channels 38. When the cathode metal 20 includes cathode oxide channels 38, the electrolyte 40 can be positioned in the cathode oxide channels 38. The electrolyte 40 can be a liquid, solid, gel or other medium and can be absorbed in the separator 24. The electrolyte 40 can include one or more salts dissolved in one or more solvents. For instance, the electrolyte 40 can be a mixture of a weak acid and a salt of a weak acid, preferably a salt of the weak acid employed, in a polyhydroxy alcohol solvent. The electrolytic or ion-producing component of the electrolyte 40 is the salt that is dissolved in the solvent.

A capacitor constructed according to FIG. 1A through FIG. 1G can be an electrolytic capacitor such as an aluminum electrolytic capacitor, a tantalum electrolytic capacitor or a niobium electrolytic capacitor. An electrolytic capacitor is generally a polarized capacitor where the anode metal oxide 12 serves as the dielectric and the electrolyte 40 effectively operates as the cathode 16.

Figure 2A:
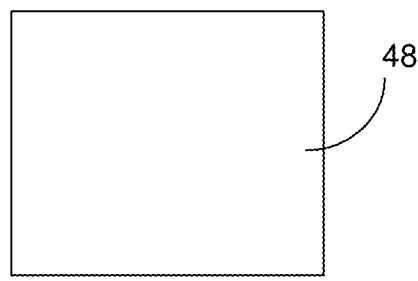
Figure 2B:
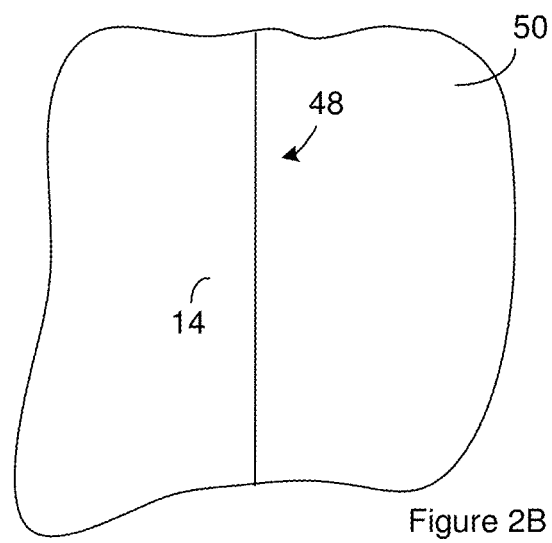
Figure 2C:
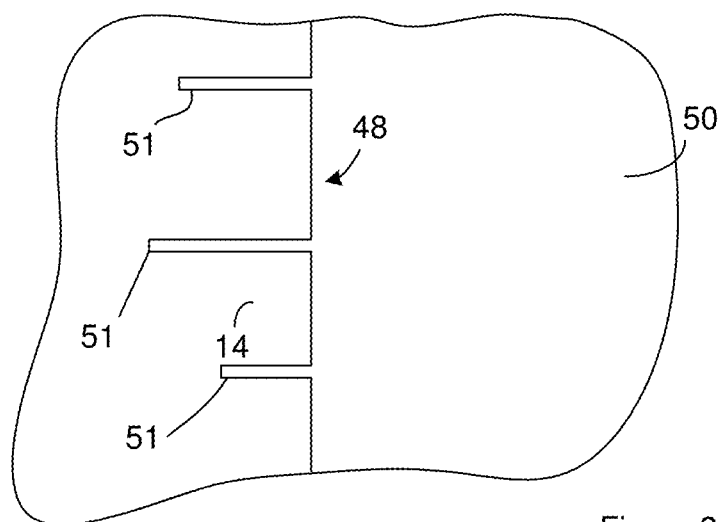

FIG. 2A through FIG. 2I illustrate a method of generating an anode for use in a capacitor constructed according to FIG. 1A through FIG. 1G. FIG. 2A is a sideview of a sheet of material 48. As will be evident below, one or more anodes are constructed from the sheet of material 48. The sheet of material 48 can be acquired either by fabrication or purchase from a supplier. FIG. 2A is a topview of the sheet of material 48 and shows a face of the sheet of material 48 positioned between edges of the sheet of material 48. FIG. 2B is a portion of a cross section of the sheet showing an interface between the face of the sheet of material 48 and the atmosphere 50 in which the sheet is positioned.

The sheet of material 48 can include, consist of, or consist essentially of the anode metal 14. In some instances the sheet of material 48 is a sheet of aluminum. In some instances, the sheet of material is aluminum and has one, more than one, or all of the characteristics selected from the group consisting of at least about 99.98% pure, at least about 80% crystal texture in the (1, 0, 0) direction, and a thickness in the range from about 85 microns to about 120 microns.

A surface area enhancement phase can be performed so as to increase the surface area of the sheet of material 48. For instance, the preliminary channels 51 can be formed in the sheet of material 48 so as to provide the sheet of material 48 with the cross section of FIG. 2C. The preliminary channels 51 can be created by chemical etching followed by an electrochemical etch. The chemical etch can be performed on the sheet of material 48 without applying an electrical potential across the sheet of material 48 so as to cause an electrical current to flow through the sheet of material 48.

The chemical etch can be an etch resulting from galvanic corrosion. For instance, the chemical etch can be performed by placing the sheet of material 48 fully or partially in a chemical etch bath such that at least one face of the sheet of material 48 is in direct physical contact with the chemical etch bath for a chemical etch duration. The chemical etch bath can be an electrolytic solution. At the expiration chemical etch duration, the chemical etch can be stopped. For instance, sheet of material 48 can be removed from the chemical etch bath or the electrochemical etch can be started.

Figure 2D:
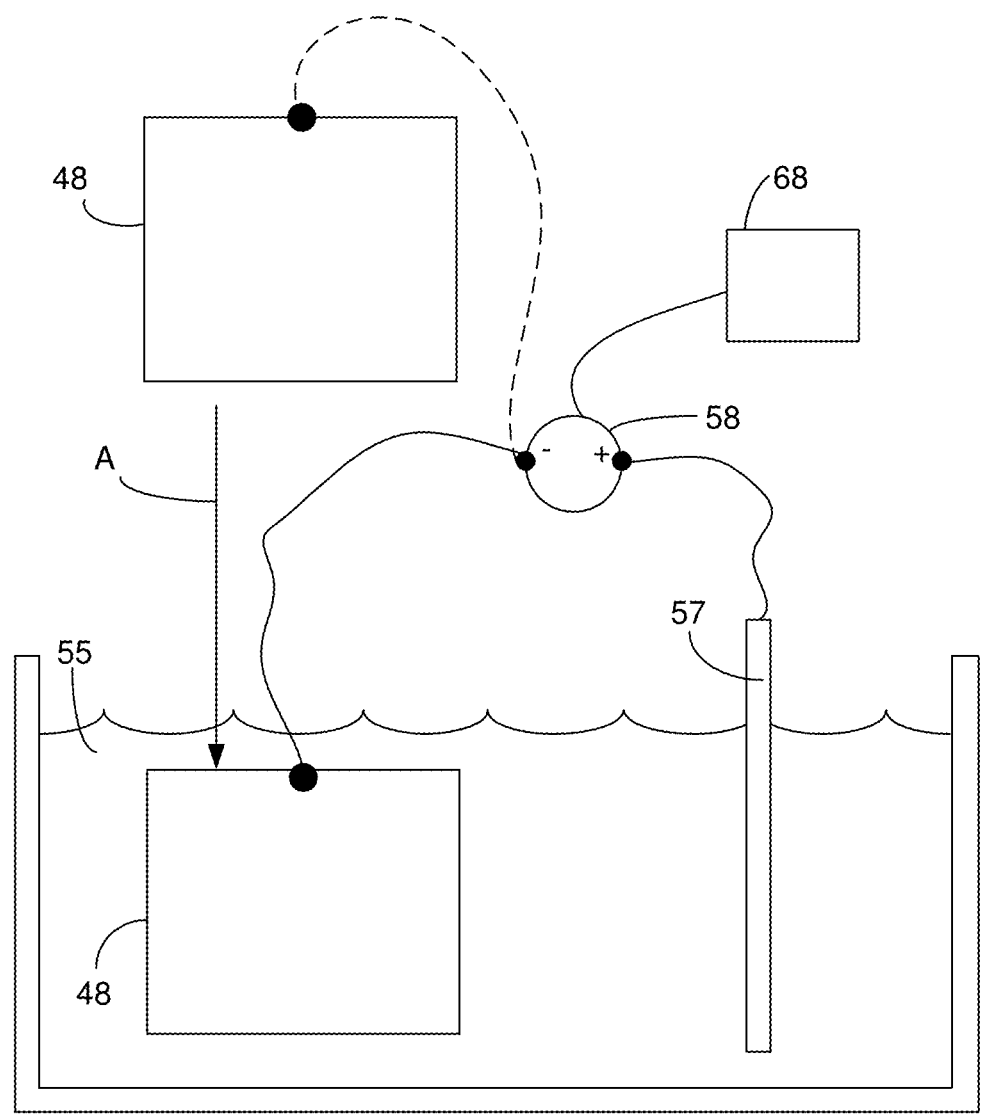
Figure 2E:
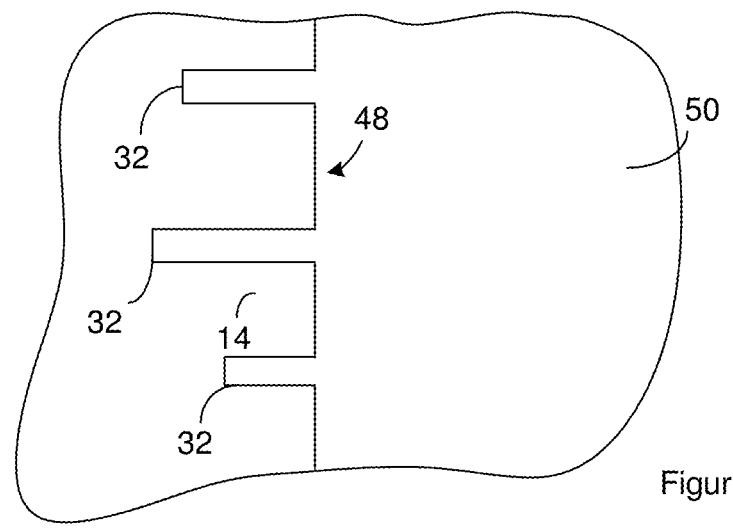
Figure 2F:
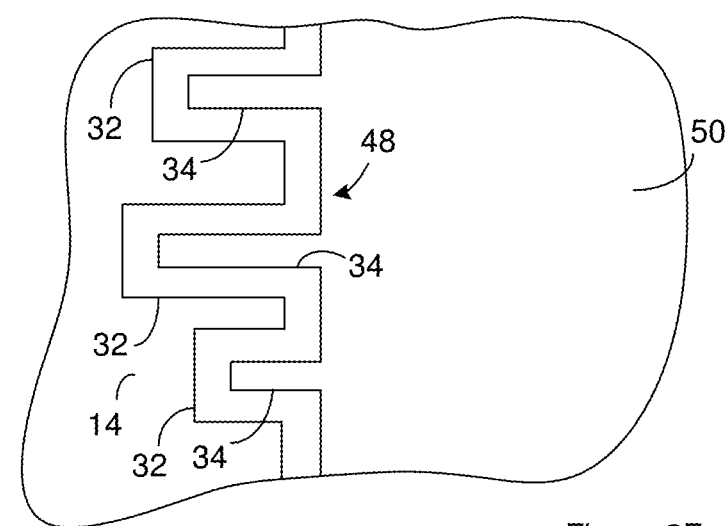

FIG. 2D illustrates an electrochemical etch system that is suitable for performing an electrochemical etch. The electrochemical etch system includes a reservoir that holds an etch bath 55 that can serve as the electrochemical etch bath. A cathode 57 is in contact with the etch bath 55. Suitable cathodes 57 include, but are not limited to, titanium, glassy carbon, and graphite.

As shown by the arrow labeled A in FIG. 2D, the sheet of material 48 is placed in electrical communication with a potential source 58 that is in electrical communication with the cathode 57. For instance, a wire or electrical cable can be clipped to the sheet of material 48. Suitable potential sources 58 include, but are not limited to, DC power sources such as a DC power supply, rectifier power supply, and a battery. The sheet of material 48 can be placed fully or partially in the etch bath 55 as illustrated by the arrow labeled A in FIG. 2D. The sheet of material 48 is placed in the etch bath 55 such that at least one face of the sheet of material 48 is in direct physical contact with the etch bath 55. The etch bath 55 can be a liquid.

The electrochemical etch is performed by using the potential source 58 to apply an electrical potential across the sheet of material 48 such that an electrical current passes through the sheet of material 48. The electrochemical etch is performed for an electrochemical etch duration. In some instances, the electrochemical etch is performed such that a constant current or substantially constant current flows through the sheet of material for the etch duration. Suitable electrochemical etch durations include, but are not limited to electrochemical etch durations greater than 30 seconds or 90 second and/or less than 2 minutes or 4 minutes. At or after occurrence of the electrochemical etch duration, the electrochemical etch can be stopped. For instance, the sheet of material 48 can be removed from the electrochemical etch bath and/or the application of the electrical potential across the sheet of material 48 can be stopped.

In some instances, the etch bath 55 serve as the electrochemical etch bath and the chemical etch bath. In these instances, the sheet of material 48 can be placed in electrical communication with the potential source 58 as shown in FIG. 2D. The sheet of material 48 can be placed fully or partially in the etch bath 55 as illustrated by the arrow labeled A in FIG. 2D. The sheet of material 48 is placed in the etch bath 55 such that at least one face of the sheet of material 48 is in direct physical contact with the etch bath 55. To perform the chemical etch, the sheet of material 48 can remain in the electrochemical etch bath for the chemical etch duration without the potential source applying the potential across the sheet of material 48 for the chemical etch duration. Upon expiration of the chemical etch duration, the potential source can be used to apply the electrical potential across the sheet of material 48 so as to perform the electrochemical etch as described above.

Suitable temperatures for the etch bath include, but are not limited to, temperatures greater than 70 or 78° C. and/or less than 85 or 96 C during the chemical etch bath duration and/or during the electrochemical etch bath duration. Low temperatures during the chemical etch can require additional time to achieve the needed level of pitting while higher temperatures can result in an undesirably high level of pitting. During the electrochemical etch, the temperature can affect the tunnel morphology. For instance, temperature can affect tapering of the tunnels and/or the difficulty of removing etched materials from within the tunnels.

Electronics 68 can be in electrical communication with the electrochemical etch system. The electronics can control the operation of the electrochemical etch system. For instance, the electronics 68 can determine when the sheet of material 48 has been placed in the etch bath 55 and can begin the electrochemical etch upon expiration of the chemical etch duration. For instance, an operator can place the sheet of material in the etch bath. Once the sheet of material is in the desired location in the etch bath, the user can active a user interface such as pressing a button to indicate to the electronics that the sheet of material 48 is placed in the etch bath 55. In response, the electronics can start measuring the time of the chemical etch. Upon or after the electronics determining that the electrochemical etch duration has passed, the electronics can start the electrochemical etch by applying to the sheet of material 48 the electrical potential for the electrochemical etch.

One method that can be used to determine when the sheet of material has been placed in the etch bath 55 is to use the potential source to apply a test potential to the sheet of material 48. When the sheet of material 48 is placed in the etch bath 55, the test potential causes an electrical current to pass through the sheet of material 48. As a result, the electronics determine that the sheet of material 48 has been placed in the etch bath 55 in response to the presence of the electrical current through the sheet of material 48.

Once the electronics 68 determine that the sheet of material 48 has been placed in the etch bath 55, the electronics can stop the application of the test potential to the sheet of material for the remainder of the chemical etch duration and/or stop the flow of the electrical current through the sheet of material 48 for the remainder of the chemical etch duration. In some instances, the electronics 68 can continue to apply the test potential to the sheet of material for the remainder of the chemical etch duration. In some instances, there is a galvanic potential across the sheet of material in addition to the potential applied to the electronics. In some instances, the total of the test potential and/or the galvanic potential applied to the sheet of material 48 is low enough to prevent electrochemical etching of the sheet of material. Accordingly, the test potential and/or the galvanic potential applied across the sheet of material during the chemical etch can be less than 5% or 1% of the total electrical potential applied across the sheet of material during the electrochemical etch. For instance, the test potential and/or the galvanic potential electrical potential applied across the sheet of material during the chemical etch can be less than 6V, or 1V. Additionally or alternately, in some instances, the test potential applied by the electronics and/or the galvanic potential can continue to drive an electrical current through the sheet of material 48 for the remainder of the chemical etch duration. In these instances, the level of electrical current through the sheet of material 48 is low enough to prevent electrochemical etching of the sheet of material 48. Accordingly, the electrical current passed through the sheet of material 48 during the chemical etch can be less than 5% or 1%, of the electrical current passed through the sheet of material during the electrochemical etch. For instance, the electrical current passed through the sheet of material during the chemical etch can be less than 0.02 amps/cm$^2$.

In some instances, at least one bath selected from the etch bath, the chemical etch bath, and the electrochemical etch bath includes one or more acids. Suitable acids include, but are not limited to, hydrochloric acid; mineral acids such as sulfuric, nitric, hydrobromic, and hydrofluoric acid; and other inorganic acids such as phosphoric acid; and organic acids such as formic, acetic, chloroacetic, trichloroacetic and trifluoroacetic acid. Some of these acids such as sulfuric can act as an oxidizer and/or provides the desired viscosity levels.

The bath can include one or more secondary acids. Suitable secondary acids include, but are not limited to, nonafluorobutanesulfonic acid (FBSA) and salts of FBSA such as potassium nonafluorobutanesulfonic acid (KFBS). In some instances, the secondary acids act as a surfactant that can increase tunnel density. Suitable individual or collective concentrations for the one or more secondary acids include, but are not limited to, concentrations in a range of 2 parts per million (PPM), 5 parts per million (PPM), or 100 parts per million (PPM) to about 100 parts per million (PPM), 500 parts per million (PPM), or 1000 parts per million (PPM). In some instances, the individual or collective concentrations for the one or more secondary acids are less than 1000 parts per million (PPM).

The bath also includes one or more oxidizers. Suitable oxidizers for use in the present invention include, but are not limited to, sodium perchlorate. In some instance, a combination of sodium persulfate and sodium perchlorate is used. The individual or collective concentrations of the one or more oxidizers can be in the range of about 2 parts per million (PPM), 5 parts per million (PPM), or 100 parts per million (PPM) to about 100 parts per million (PPM), 500 parts per million (PPM), or 1000 parts per million (PPM). The individual or collective concentrations of the one or more oxidizers can be in a range of 1.5% by weight, 3.0% by weight, or 5.0% by weight to 5.5% by weight, 7.0% by weight, or 10% by weight.

The bath can include one or more bath metals selected such that the anode metal in the sheet of material is corroded by galvanic corrosion when the sheet of material is fully or partially immersed in the bath. Surprisingly, galvanic corrosion does not consume or substantially consume a bath metal such as molybdenum. When the sheet of material includes or consists of aluminum, or tantalum; molybdenum can serve as the bath metal and the bath can include one or more molybdenum-containing components.

The molybdenum-containing component can be elemental molybdenum or can be a compound that includes the molybdenum. A compound that includes the molybdenum can be neutral or can be charged. Suitable molybdenum-containing components include, but are not limited to, compounds with fewer than 5, or 15 atoms. In some instances, the molybdenum-containing component is dissolved in the bath and the molybdenum is present in the bath as a cation in one or more oxidation states selected from the group consisting of (I), (II), (III), (IV), (V), and (VI). Additionally or alternately, in some instances, the molybdenum-containing component includes the molybdenum linked directly to one or more components selected from a group consisting of oxygen, chloride, nitrogen, phosphorous, and sulfur. Examples include a molybdenum-containing component where the molybdenum is linked directly to a nitrogen in a nitrate, a phosphorus in a phosphate, and/or a sulfur in a sulfate. In some instances, the molybdenum-containing component is selected from a group consisting of molybdic acid, molybdenum trioxide, sodium molybdate dihydrate, molybdenum chloride, and molybdenum sulfide, molybdenum dioxide, and molybdenum chloride. Examples of the molybdenum-containing components are compounds with the molybdenum in the III, IV, V, or VI oxidation state. For instance, suitable molybdenum-containing components include, but are not limited to, molybdenum (VI) trioxide, sodium molybdate dihydrate, molybdenum (V) chloride, and molybdenum (IV) sulfide, molybdenum (IV) dioxide, AND molybdenum (II) chloride. The oxidation state of the molybdenum cations in the bath may be different from the oxidation state in the molybdenum-containing component. Suitable concentrations for the molybdenum in the bath include, but are not limited to, concentrations greater than 0 ppm, or 30 pp and/or less than 100 ppm, or 300 ppm.

The pH of the bath can affect the rate of galvanic corrosion. In some instances, the components of the bath are selected to provide the bath with a pH greater than 0, or 0.05 and/or less than 2, 2.5, or 4. One example of the bath includes 60 to 80 ppm molybdic acid, 0.62 wt % hydrochloric acid, 0.92 wt. % sulfuric acid, 3.5 wt. % sodium perchlorate, and 60 ppm nonafluorobutanesulfonic acid (FBSA). In some instances, the capacitance has started to drop as the pH exceeds 2.5.

As noted above, the inventors have surprising found a relationship between the chemical etch duration and the capacitance of an anode constructed from the sheet of material and/or of a capacitor that includes one or more anodes constructed from the sheet of material. Suitable chemical etch durations include, but are not limited to, times greater than 0.0 s, 3 s, and 4 s and/or less than 200 s, or 400 s. When the etch bath is a liquid electrolyte, the sheet of material includes or consists of aluminum, the bath metal is molybdenum, examples of the chemical etch duration include, but are not limited to, times greater than 0.0 s, 3 s, or 5 s and/or less than 15 s, 45 s, or 100 s.

In some instances, the surface area enhancement phase also includes widening of the preliminary channels 51. Widening of the preliminary channels can reduce or stop the anode metal oxide 12 from filling the channels 32. For instance, the distance across the preliminary channels 51 on the sheet of FIG. 2C can be increased to provide a sheet of material 48 having the channels 32 shown in the cross section of FIG. 2E. In some instances, the preliminary channels 51 are fabricated and widened so as to remove more than 52% or 60% of the sheet of material 48 from the sheet of material 48 and/or to create more than 30 million channels/cm$^2$ of the sheet of material 48.

Suitable methods for widening the preliminary channels 51 include, but are not limited to, chemical and electrochemical processes. In one example of the widening process, widening of the preliminary channels 51 includes immersing at least a portion of the sheet of material 48 in an electrolyte solution that includes, consists of, or consists essentially of a chloride or nitrate. Additional examples of suitable methods for widening of the preliminary channels 51 and/or additional details about the above methods of widening preliminary channels 51 can be found in U.S. patent application Ser. No. 05/227,951, filed on Feb. 22, 1972, granted U.S. Pat. No. 3,779,877, and entitled "Electrolytic Etching of Aluminum Foil;" U.S. patent application Ser. No. 06/631,667, filed on Jul. 16, 1984, granted U.S. Pat. No. 4,525,249, and entitled "Two Step Electro Chemical and Chemical Etch Process for High Volt Aluminum Anode Foil;" U.S. patent application Ser. No. 11/972,792, filed on Jan. 11, 2008, granted U.S. Pat. No. 8,535,527, and entitled "Electrochemical Drilling System and Process for Improving Electrical Porosity of Etched Anode Foil;" U.S. patent application Ser. No. 10/289,580, filed on Nov. 6, 2002, granted U.S. Pat. No. 6,858,126, and entitled "High Capacitance Anode and System and Method for Making Same;" and U.S. patent application Ser. No. 10/199,846, filed on Jul. 18, 2002, granted U.S. Pat. No. 6,802,954, and entitled "Creation of Porous Anode Foil by Means of an Electrochemical Drilling Process;" each of which is incorporated herein in its entirety.

The anode metal oxide 12 is formed on the anode metal 14 that is exposed in the sheet of material 48. For instance, the anode metal oxide 12 can be formed on the anode metal 14 that is exposed in FIG. 2E so as to provide a sheet of material 48 according to FIG. 2F. The anode metal oxide 12 extends into the channels 32 so as to provide anode oxide channels 34. Forming the anode metal oxide 12 on the exposed anode metal 14 can include converting a portion of the existing anode metal 14 to the anode metal oxide 12 or adding a layer of the anode metal 14 over the previously existing anode metal 14. Converting a portion of the existing anode metal 14 to the anode metal oxide 12 can include reacting the anode metal 14 with a component such as oxygen. The anode metal oxide 12 is formed so the anode metal oxide 12 is in a first phase of the anode metal oxide 12. As an example, when the anode metal 14 is aluminum, the boehmite phase (AlO(OH)) of aluminum oxide is formed as the anode metal oxide 12. The first phase of the anode metal oxide 12 is desirable for the final capacitor. For instance, the first phase of the anode metal oxide 12 generally serves as the dielectric for the capacitor.

One or more anode precursors 56 are extracted from the sheet of material 48. Accordingly, a portion of the sheet of material 48 serves as the anode precursor 56. Suitable methods of removing an anode precursor 56 from the sheet of material 48 include, but are not limited to cutting the anode precursor 56 out of the sheet of material 48. A suitable method of cutting the anode precursor 56 out of the sheet of material 48 include mechanical cutting method such as die cutting where the anode precursor is punched or stamped from a sheet of material using a mechanical die. Another suitable method of cutting the anode precursor 56 out of the sheet of material 48 includes no-contact cutting methods such as laser cutting of the anode precursor 56. FIG. 2G illustrates use of a laser 58 to cut anode precursors 56 out of a sheet of material 48 constructed according to FIG. 2F.

The flat or planar shape of the sheet of material provided by thermal compression can improve the cutting processes. Mechanical cutting of a warped sheet of material can cause the sheet of material to move in response to the cutting operation. Laser cutting of a warped sheet of material causes the distance between the focal point and the sheet of material to change across the sheet of material. As a result, cutting of warped sheets of material provides inconsistent results. The flattening of the sheet of material provided by thermal compression can increase the consistency of the cutting results.

As noted above, laser cutting may provide an increase in yield and efficiency when compared with mechanical cutting methods. Laser cutting of the sheet of material can cause melted portions of the sheet of material to solidify and stay on the resulting anode precursor. Alternately, portions of the sheet can redeposit on the resulting anode precursor during the laser cutting process. These excess materials can be reduced by using a pulsed laser beam. The short pulse durations are possible with pulsed lasers can provide very high peak powers for moderately energetic pulses. The increased peak power can provide vaporization of the sheet of material during the laser cutting process. This vaporization can eject the material from any recess or trench created in the sheet of material through the top of the sheet of material. Since the material is ejected from the sheet of material, the material is not available to re-solidify or re-deposit on the sheet of material.

In some instances, the duration of the pulse is greater than 0 s, or a femtosecond ($10^{-15}$ s) and/or less than a microsecond ($10^{-6}$ s). In one example, the duration of the pulse is greater than 100 femtoseconds and less than 900 femtoseconds. The time between pulses is inversely related to the pulse frequency. Suitable pulse frequencies can be greater than 0 Hz, or 100 Hz, and/or less than 2000 kHz. In one example, the pulse frequency is in a range of 200 kHz to 600 kHz. In some instances, the duration of the pulse is greater than 0 s, or a femtosecond ($10^{-15}$ s) and/or less than a microsecond ($10^{-6}$ s) and the pulse frequency is greater than 0 Hz, or 100 Hz, or 100 kHz and/or less than 2000 kHz.

The power density of the laser beam at the sheet of material can be at a level that a single pulse elevates the temperature of the sheet of material above the boiling point of the anode metal and vaporizes the anode metal. In some instances, power density of the laser beam is such that at least a portion of the sheet of material that is illuminated by the laser reaches the boiling point of the anode metal and vaporizes in a period of time less than or equal to the duration of one pulse when the illuminated portion of the sheet of material is at temperature (23° C. or 25° C.) before the pulse. In an example where the anode metal is aluminum, the pulse duration is 820 femtoseconds, the pulse frequency is 400,000 pulses per second, and the laser beam has a power density $7.99 \times 10^{11}$ W/cm$^2$ at the surface of the sheet of material. Suitable power densities include, but are not limited to, power densities greater than 0 W/cm$^2$, $1 \times 10^{11}$ W/cm$^2$, or $2 \times 10^5$ W/cm$^2$ and/or less than $9 \times 10^{11}$ W/cm$^2$, or $2 \times 10^5$ W/cm$^{12}$. The combination of elevated power densities and reduced pulse durations reduces the amount of heat transferred to the sheet of material. However, adjusting these parameters may not be sufficient to address the increase in deformation that can result from using laser cutting of the anodes rather than stamped or punched cutting of the anodes.

The path of the laser beam across the face of the sheet of material can be controlled by electronics and/or software. The electronics and/or software can move the laser beam relative to the sheet of material and/or the sheet of material relative to the laser beam. In FIG. 2G, the solid lines and the dashed lines that show the outline of an anode precursor in the sheet of material represent the laser beam pathway during the process of cutting the anode precursor from the sheet of material. As a result, the laser is incident on the anode metal oxide during at least a portion of the laser cutting.

Tuning the characteristics for the laser beam path across the sheet of material can also reduce the leakage and deformation to or even below the levels associated with stamping or punching of anodes. For instance, the rate at which the beam is scanned across the sheet of material can be tuned. Faster scan rates reduce the amount of energy that is absorbed by the anode precursor. In some instances, the laser beam is scanned across the sheet of material at a rate greater than 0 mm/sec, 100 mm/sec, or 600 mm/sec, and/or less than 900 mm/sec, or 1100 mm/sec.

Reducing the spot size can also reduce the amount of thermal energy transferred to the sheet of material. Suitable spot sizes include, but are not limited to, spot having a diameter or major axis greater than 10 microns, 30 microns and/or less than 50 microns, or 150 microns. Additionally or alternately, the spot size can be selected to produce spot overlaps less than 100%. A spot is the area of the sheet of material illuminated by the laser beam during a pulse. Spot overlap is the overlap of a spot with the spot provided by the previous pulse. Suitable spot overlaps include spot overlaps greater than 70%, or 90% and/or less than 100%. The spot size can be selected to provide these levels of spot overlap when combined with the above scan rates and pulse frequencies.

Increasing the beam scan rate can reduce the depth that the laser beam cuts into the sheet of material. As a result, multiple passes of the laser beam along a pathway may be necessary in order to completely cut the anode precursor out of the sheet of material. This result is evident in the pathway labeled P FIG. 2G. The pathway includes dashed lines that indicate where the laser beam has cut into the sheet of material without cutting through the sheet of material. The pathway also includes solid lines that indicate the portion of the anode precursor outline where the laser beam has cut through the sheet of material. Additionally, the arrow labeled A indicates the travel direction travel for the laser beam relative to the anode precursor. At the start of the laser cutting, the laser beam may be incident on the anode metal oxide. Once the laser beam has cut through the anode metal oxide, the laser beam is incident on the anode metal.

The need for multiple passes of the laser beam in order to cut through the sheet of material means that each location along the beam pathway is not exposed to the leaser beam energy for a pass interval. The pass interval can be the time between passes of the laser beam and/or can be the period of time that passes between each point along the pathway being exposed to the laser beam. Suitable pass intervals include, but are not limited to, pass intervals more than 0.1 seconds per pass and/or less than 3 seconds per pass. In some instances, the pass interval is selected such that more than 5, or 10 and/or less than 100 passes of the laser beam around the entire outline of the anode precursor are required to completely extract an anode precursor from the sheet of material.

The laser pathway can includes multiple different tracks. FIG. 2H is a topview of a portion of a sheet of material 48. A portion of a laser pathway on the sheet of material is labeled P. The laser pathway includes a first track 59 represented by dashed lines and a second track 60 represented by solid lines. The first track 59 represents the track that the laser follows during a pass along the laser pathway. The second track 60 represents the track that the laser follows during a different pass along the laser pathway. The first track 59 has a width labeled w and the second track 60 has a width labeled W. When the first track 59 and the second track 60 are followed by the same laser or by lasers with the same spot size, the width of the first track 59 will be the same or about the same as the width of the second track 60.

The second track 60 is offset from the first track 59 by a distance labeled OS in FIG. 2H. The amount of offset can be selected such that the second track 60 partially overlaps the first track 59 as shown in FIG. 2H. The use of partially overlapping tracks while laser cutting the anode precursor widens the trench that the laser forms in the sheet of material to a width larger than the spot diameter. The cutting of a wider trench can reduce the amount of thermal energy that is applied to previously formed surfaces in the trench. The track overlap percentage can be the overlap distance divided by the width of the overlapped track. Suitable track overlap percentages include, but are not limited to, track overlap percentages greater than 25% or 30% and/or less than 50% or 75%. The offset distance can be a function of spot size. For instance, when the spot size has a diameter of 40 microns, a suitable offset distances can be any distance between 0 and 40 microns such as 10 to 30 microns.

In some instances, the different tracks extend around the perimeter of the anode and/or surround the perimeter of the anode. For instance, the entire length of the laser pathway shown FIG. 2G can include two tracks that partially overlap as shown in FIG. 2H. In other words, the laser pathway of FIG. 2H can represent the laser pathway of any straight portion of the laser pathway shown FIG. 2G. Accordingly, the laser can trace all, or substantially all, of the anode perimeter along one track and later trace all, or substantially all, of the anode perimeter along another track that partially overlaps the prior track as described above. Alternately, different tracks can partially overlap along one or more portions of the anode perimeter but completely overlap along one or more other portions of the anode perimeter.

Although the laser pathway in FIG. 2H is illustrated as having two tracks, the laser pathway can include a single track or more than two tracks. During the laser cutting process, a track can be followed once or more than once. For instance, when a laser pathway includes two tracks as is shown in FIG. 2H, the laser can alternate between different tracks on subsequent passes. As an example, the laser can follow the first track 59, the second track 60, the first track 59, the second track 60, and so on until the trench extends through the sheet of material and the anode precursor is extracted from the sheet of material.

In some instances, the anode precursor is fabricated using one, two, three, four, five or six parameters selected from the group consisting of a laser pulse duration, pulse frequency, power density, scan rate, pass interval, and pass number. In these instances, the laser pulse duration is 400 femtoseconds, the laser pulse frequency is 400 kHz, the power density is $7.99 \times 10^{11}$ W/cm$^2$, the scan rate is 720 mm/sec, the pass interval is 0.25 s, and the pass number is 60.

Using a laser to extract the one or more anode precursors 56 from the sheet of material 48 can convert at least a portion of the first phase of the anode metal oxide 12 to a second phase of the anode metal oxide 12. For instance, using a laser to cut a sheet of material 48 with aluminum as the anode metal 14 and the boehmite phase of aluminum oxide (AlO(OH)) as the anode metal oxide 12 can convert the boehmite phase of aluminum oxide to the alpha-corundum oxide ($\alpha$-Al$_2$O$_3$) phase of aluminum oxide. This conversion is believed to be a result of the heat generated during the laser cutting process. As a result, the conversion primarily occurs at and/or near the edge of the anode precursor 56. The second phase of the anode metal oxide 12 is often undesirable. For instance, the second phase of the anode metal oxide 12 can be more electrically conductive than the first phase of the anode metal oxide 12. As an example, the alpha corundum oxide ($\alpha$-Al$_2$O$_3$) phase of aluminum oxide has properties of a semiconductor. As a result, the alpha phase corundum oxide ($\alpha$-Al$_2$O$_3$) is not suitable for use as a dielectric and is accordingly associated with undesirably high levels of leakage and deformation. However, alpha phase corundum oxide ($\alpha$-Al$_2$O$_3$) is very stable and is difficult to convert back into the boehmite phase of aluminum oxide. While adjustments to the laser cutting parameters disclosed above can partially address the leakage and deformation associated with the this conversion from the first phase of the anode metal oxide to the second phase of the anode metal oxide, an oxide extraction phase discussed in more detail below can further reduce the leakage and deformation caused by this conversion.

The process of extracting the anode precursor 56 from the sheet of material 48 can leave the anode metal 14 exposed at the edges of the anode precursor 56. In some instances, a hydration layer is optionally formed on the exposed anode metal 14. The hydration process builds a non-voltage supporting hydration layer that helps to both create a higher quality anode metal oxide 12 and speed up its formation during a subsequent aging process. The hydration process lowers the aging time by using a hydration oxide backbone to speed formation of the anode metal oxide 12 during aging. In some instances, the hydration process cleans up the edges of anode precursor 56 by "smoothing" any metal burrs on the edges. The detachment of the burrs and "smoothing" can be increased by use of sonic or ultrasonic vibrational energy when forming the hydration layer.

A suitable method of creating the hydration layer includes, but is not limited to, immersing at least a portion of the anode precursor 56 in a bath the includes, consists of, or consists essentially of water. In one example, the water is de-ionized. The bath may be held at a temperature between 60 and 100° C., and preferably at about 95° C. The anode precursor 56 may remain immersed in the bath for a period of time greater than 2 minutes and/or less than 20 minutes to form the hydration layer. In some instances, the bath is sonicated at either sonic or ultrasonic frequencies. The formation of the hydration layer will help to form a better quality oxide during a subsequent aging process.

A passivation layer can optionally be formed on the exposed anode metal that is not covered by the anode metal oxide or the hydrate of the anode metal. A suitable method for forming the passivation layer includes, but is not limited to, immersing at least a portion of the anode precursor 56 in a second bath that includes, consists of, or consists essentially of ammonium dihydrogen phosphate. In some instances, the second bath is maintained at a temperature greater than 51° C. and/or less than 90° C., or 70° C. Additionally or alternately, the second bath can contain more than 0.1 wt %, or 5.0 wt %, and/or less than 2.0 wt % ammonium dihydrogen phosphate. The anode precursor 56 can be at least partially immersed in the second bath for a time greater than one minute and/or less than four minutes. After removing the anode precursor 56 from the second bath, the anode precursor 56 can be rinsed under de-ionized water for a time greater than one minute and/or less than 12 minutes.

The one or more anode precursors 56 constructed according to FIG. 2A through FIG. 2H are included in a capacitor precursor 61 according to FIG. 2I. For instance, one or more of the anode precursors 56 are combined with one or more separators 24 and one or more cathodes 16 so as to form an electrode assembly 22 with the components arranged as disclosed in the context of FIG. 1A through FIG. 1E. The electrode assembly 22 is placed in a capacitor case 26 along with the electrolyte 40. Any electrical connections needed for operation of the capacitor precursor 61 are made and the capacitor case 26 is sealed.

Although not shown in FIG. 2A through FIG. 2I, one or more masks can be placed on the sheet of material before fabricating the preliminary channels in the sheet of material 48. The masks can be positioned to protect areas of the sheet of material from formation of the channels. For instance, the electrodes often have one or more inactive areas that are attached to electrical conductors such as tabs that provide electrical communication between the electrodes and a capacitor terminal. These inactive areas can be masked before fabricating the preliminary channels and the mask(s) can be removed after forming the preliminary channels 52 in the sheet of material 48 or after widening of the preliminary channels 52. In some instances, the mask(s) are removed before the anode metal oxide 12 is formed on the anode metal 14.

The capacitor precursor 61 can optionally be put through an aging phase configured to form an anode metal oxide 12 on the edges on the one or more anode precursors 56 in the capacitor and/or on any other exposed anode metal 14. The capacitor precursor 61 can optionally be put through a testing phase configured to test the capacitor precursor 61 for charge and discharge functionality.

An example of a suitable method of forming the anode metal oxide 12 on the anode metal 14 includes an optional hydration layer formation operation, one or more oxide formation operations, one or more thermal treatments, and one or more capacitance tests.

The hydration layer formation operation forms a hydration layer in direct contact with the anode metal 14. The hydration layer can include, consist of, or consist essentially of the anode metal 14, hydrogen, and water. For instance, the hydration layer can include, consist of, or consist essentially of a hydrate of the anode metal 14. When the anode metal 14 is aluminum, the hydration layer can include, consist of, or consist essentially of aluminum hydrate.

In some instances, the hydration layer is formed on the anode metal 14 by placing the sheet of material 48 in a bath liquid that includes, consists of, or consists essentially of water. In one example, the bath liquid is de-ionized water. The bath liquid may be held at a temperature between 60° C. and 100° C. In some instances, the bath liquid is maintained at about 95° C. The sheet of material 48 can remain in the bath liquid for a formation time. The formation time can be greater than 1 minute and/or less than 20 minutes. The hydration can help form a better quality oxide during one or more subsequent oxide formation operations. In some instances, the bath of water may be sonicated at either sonic or ultrasonic frequencies.

An example of a suitable oxide formation operation includes, but is not limited to, mechanisms that convert existing anode metal 14 to anode metal oxide 12 such as anodic oxidation. When the anode metal 14 is aluminum, anodic oxidation forms a layer of the boehmite phase of aluminum oxide (AlO(OH)) on a layer of aluminum. In anodic oxidation, the sheet of material 48 is placed in an electrolytic bath while a positive voltage is applied to the sheet of material 48 so as to drive an electrical current through the sheet of material 48 and the electrolytic bath. The thickness of the layer of anode metal oxide 12 can be increased by increasing the applied voltage and/or by increasing the duration of the applied voltage.

When a hydration layer is present on the sheet of material 48 before the oxide formation operation, the oxide formation operation can replace with the oxide and/or consume the hydration layer formed during the hydration layer formation operation. As a result, the hydration layer is generally no longer present or no longer substantially present on the layer of material after the oxide formation operation.

An example of a suitable electrolytic bath for use in anodic oxidation includes an ionogen, a solvent, an optional phosphate, and one or more optional additives. Exemplary ionogens include, but are not limited to, dimethyl amine sebacate (DMAS) and citric acid. The ionogens may be present in the electrolytic bath in amounts between about 0.1 wt % and about 2 wt % based on the total weight of the electrolytic bath. In one embodiment, the amount of ionogen in the electrolytic bath may be about 0.5 wt %. In one embodiment, the electrolytic bath includes 0.5 wt % citric acid as an ionogen agent in an aqueous solvent. The phosphate can aid in the creation of a boehmite phase in the oxide layer without damaging the leakage current of the oxide layer. When present in the electrolytic bath, the phosphate may constitute between about 5 ppm and about 20 ppm of the electrolytic bath. Exemplary phosphates include, but are not limited to phosphate salts. In one embodiment, the temperature of the electrolytic bath is maintained at an elevated temperature during the oxide formation operation. Suitable elevated temperatures for the electrolytic bath include temperatures above 70° C. and less than 100° C. In some instances, the elevated temperature for the electrolytic bath is 85° C.

While the sheet of material is in the electrolytic bath during the oxide formation operation, the electronics can apply an electrical treatment to the sheet of material. For instance, the electronics can maintain a level of current through the sheet of material 48 at a target current. The oxide layer grows and/or reforms in response to the target current flowing through the sheet of material. The growth and/or reformation of the oxide layer causes an increase in the resistance through the sheet of material. Accordingly, the electronics can increase the applied voltage so as to maintain the target current. The voltage can be increased until a target voltage is reached. Once the target voltage is reached, the electronics can maintain the applied voltage at the level of the target voltage while the current level is allowed to change. While the target voltage is maintained, the current consumption drops as a result of the resistance increasing due to continued oxide layer growth and/or reformation. The current can be allowed to decrease to a desired leakage current level. When the desired leakage current is reached, the electronics can reduce the applied voltage to a reduced voltage. The electronics can reduce the applied voltage from the reduced voltage until the sheet of material 48 is discharged to 0 V.

Suitable target currents include, but are not limited to, target currents greater than or equal to about 2000 mA to less than or equal to about 5000 mA. When normalized to the surface area of the foil, suitable target currents include, but are not limited to, target currents greater than or equal to 7.4 milliAmps per square centimeter (mA/cm$^2$ of apparent surface area rather than actual surface area that would include channel surface area) to less than or equal to about 18.5 mA/cm$^2$ of apparent surface area. Suitable target voltages include target voltages that are greater than or equal to about 420V and less than or equal to about 510V. The desired leakage current can be between about 0.1 mA/cm$^2$ of apparent surface area and about 2.0 mA/cm$^2$ of apparent surface area. In one embodiment, the desired leakage current is about 1.1 mA/cm$^2$ of apparent surface area. Suitable reduced voltages include, but are not limited to, reduced voltages greater than or equal to 30 V and less than or equal to 60V. In some instances, the oxide formation operation process continues for up to about 3 hours before reaching the desired leakage current. The thickness of the oxide layer formed on the metal foil is generally proportional to the target voltage. In some embodiments, a layer thickness of between about 10 Angstroms and about 15 Angstroms per applied volt may be achieved.

In all or a portion of the oxide formation operations performed during the generation of the anode oxide layer, the electronics can monitor the electrolytic bath during an oxide formation operation. For example, an electrolytic bath can be monitored for conductivity. If the conductivity drops below a conductivity threshold, the ionogen can be added to the solution to increase the conductivity. Suitable conductivity thresholds include, but are not limited to, conductivity thresholds greater than 150 pS and/or less than 300 pS.

A thermal treatment elevates the temperature of the sheet of material enough to drive out water from the oxide layer formed during the one or more previous oxide formation operation(s). The removal of this water has been shown to decrease the leakage of capacitors. However, it is not desirable to remove all of the water from the oxide layer. Additionally, applying high levels of thermal energy to the sheet of material can increase the level of deformation in a capacitor that includes an electrode made from the sheet of material. As a result, reducing the amount of thermal energy applied to the sheet of material while removing water may lead to both decreased leakage and decreased deformation.

An example of a suitable thermal treatment includes placing the sheet of material in an oven at a thermal treatment temperature for a thermal treatment time. Suitable thermal treatment temperatures include, temperatures greater than 100° C., or 300° C. and/or less than 600° C., or 800° C. Suitable thermal treatment times include, times greater than 10 second, or 30 seconds, 3 minutes and/or less than 5 minutes, or 20 minutes. In some instance, the thermal treatment is performed at atmospheric pressure conditions. In some instances, all or a portion of the thermal treatments are performed while compressing the sheet of material. Compressing the sheet of material during the thermal treatments can reduce warping of the sheet of material.

A capacitance test can include a measurement of the capacitance of the sheet of material 48. The capacitance test can be performed while the sheet of material 48 is in the electrolytic bath using an approach such as a capacitance bridge or using the RC time constant with an RC charging circuit. In some instances, it may be desirable to correct capacitance measurements for effects including, but not limited to, parasitic resistance from leakage current and leakage due to elevated temperatures.

Figure 3A:
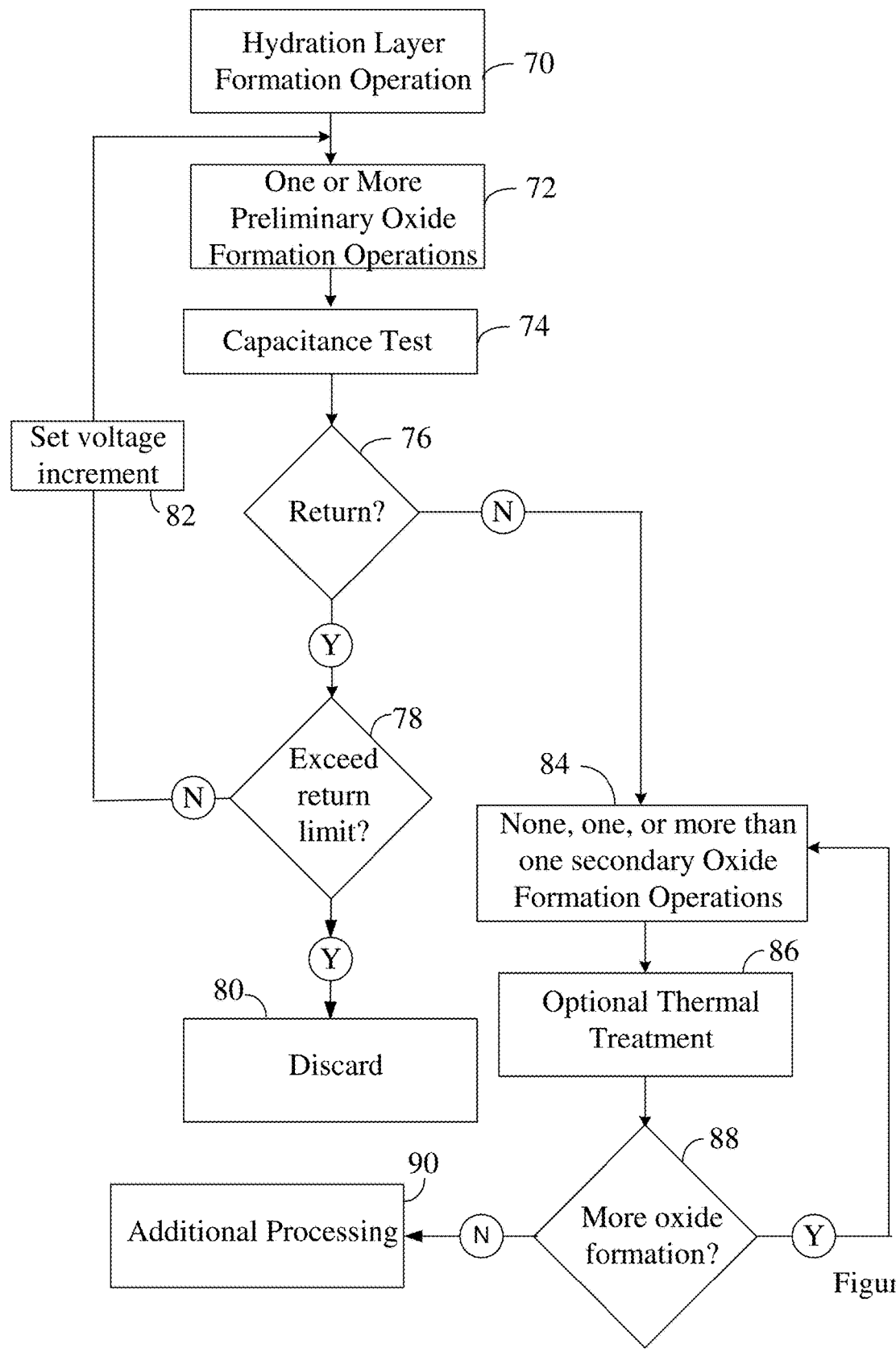
FIG. 3A illustrates a possible process flow for forming the anode metal oxide on a sheet of material.

FIG. 3A illustrates a process for forming the anode metal oxide on a sheet of material. At process block 70, the hydration layer can optionally be formed on the sheet of material. The process proceeds from process block 70 to process block 72 where a set of one or more preliminary oxide formation operations is performed on the sheet of material. Each of the preliminary oxide formation operations in the set can be conducted in accordance with the disclosed oxide formation operations. When multiple preliminary oxide formation operations are performed in a set, all or a portion of the preliminary oxide formation operations can be performed in the same electrolytic bath or in different electrolytic baths. In some instances where a set of one or more preliminary oxide formation operations are performed with the sheet of material in the same electrolytic bath, the sheet of material is not removed from the electrolytic bath between different preliminary oxide formation operations.

When multiple preliminary oxide formation operations are performed in a set, the electronics can apply an electrical treatment that is the same or different to all or a portion of the preliminary oxide formation operations included in the set. As an example where the electronics apply different electrical treatments to different preliminary oxide formation operations in the same set, the target voltage of each preliminary oxide formation operation performed in the set after the first preliminary oxide formation operation can be lower than the target voltage of the immediately prior preliminary oxide formation operation. For instance, the target voltage of each preliminary oxide formation operation in a set can determined according to Equation 1: $V_T = V_b + V_i - V_d$ where $V_T$ represents the target voltage, $V_b$ represents a base voltage, $V_i$ represents a voltage increment, and $V_d$ represents an incremental voltage drop. The value of the incremental voltage drop ($V_d$) is 0.0 V during the first preliminary oxide formation operation performed in each set. The value of the voltage increment ($V_i$) is 0.0V for the first set of the preliminary oxide formation operations performed on a sheet of material. As a result, the base voltage ($V_b$) is equal to the target voltage during the first preliminary oxide formation operation performed in the first set of preliminary oxide formation operations performed on the sheet of material.

The first preliminary oxide formation operation performed in a set is generally selected to grow the oxide layer. Subsequent preliminary oxide formation operations performed in the set preferably re-form the oxide layer so as to repair defects in the oxide layer. To increase the ratio of oxide layer reformation to oxide growth, the target voltage can be dropped between a preliminary oxide formation operation and the immediately prior preliminary oxide formation operation from the same set. The amount of the drop can be the incremental voltage drop ($V_d$). The incremental voltage drop can be the same or different for each pair of sequentially neighboring preliminary oxide formation operations in a set. In some instances, the amount of the voltage drop increases for each additional preliminary oxide formation operations performed in a set. As a result, that target voltage drops each additional preliminary oxide formation operations performed in a set. Suitable incremental voltage drops include, but are not limited to, incremental voltage drops greater than or equal to 0 V, or 0.5 V and/or less than 2.5 V, or 10 V. In some instances, the incremental voltage drop for each pair of sequentially neighboring preliminary oxide formation operations in a set is 0 V.

As another example where the electronics apply different electrical treatments to different preliminary oxide formation operations in the same set, the desired leakage current for each preliminary oxide formation operation performed in the set after the first preliminary oxide formation operation in the set can be lower than the desired leakage current of the immediately prior preliminary oxide formation operation. For instance, for all or a portion of the preliminary oxide formation operations performed after the first preliminary oxide formation operation in a set, the desired leakage current can be decreased relative to the immediately prior preliminary oxide formation operation when the immediately prior preliminary oxide formation operation is from the same set. The drop in the desired leakage current between oxide formation operations can be an incremental leakage current drop. The incremental leakage current drop can improve the quality of the oxide formed during a preliminary oxide formation operation. Suitable values for the incremental leakage current drop include, but are not limited to, incremental leakage current drops greater than or equal to 0.001 Amps and/or less than 0.1 Amps. In some instances, the incremental leakage current drop include, but are not limited to, incremental leakage current drops greater than or equal $4 \times 10^{-3}$ mA/cm$^2$ of apparent surface area and/or less than 0.4 mA/cm$^2$ of apparent surface area. In some instances, one or more sets of the preliminary oxide formation operations are configured such that all or a portion of the incremental leakage current drops are non-zero and/or all or a portion of the incremental voltage drops are non-zero.

The process proceeds from process block 72 to process block 74 where the sheet of material is tested for capacitance. In some instances, the sheet of material is tested for capacitance without being removed from the electrolytic bath in which the immediately prior preliminary oxide formation operation was performed.

The process proceeds from process block 74 to decision block 76 where a determination is made whether the process should return to process block 72. The determination can be made by comparing the measured capacitance against one or more capacitance criteria. The one or more capacitance criteria can be selected to identify when the sheet of material has an undesirably high capacitance. For instance, the measured capacitance can be compared to a capacitance threshold. When the measured capacitance falls at or above the capacitance threshold, the determination can be positive and the process can proceed to branch block 78. The capacitance threshold can be higher than the target capacitance that is desired as an average for the sheets of material. In some instances, the capacitance threshold is higher than the target capacitance by a value that is more than or equal to 0.1% or 0.5% of the target capacitance and less than or equal to 20% or 30% of the target capacitance. In some instances, the target capacitance is greater than or equal to 100 μF and less than or equal to 500 μF.

At branch block 78, the process branches in response to the number of times the sheet of material has been returned to process block 72 after capacitance testing at process block 74. When returning the sheet of to process block 72 again would cause the sheet of material to be returned to process block 72 a number of times that is more than a return limit, the process can proceed to process block 80 where the sheet of material is discarded or marked for alternative processing. When returning the sheet of to process block 72 again would not cause the sheet of material to be returned to process block 72 a number of times that exceeds the return limit, the sheet of material can proceed to process block 82.

The return limit can represent the number of times that the sheet of material can be returned to the one or more preliminary oxide formation operations at process block 72 before the sheet of material is discarded. Suitable return limits include, but are not limited to, numbers greater than zero. In some instances, the return limit is greater than or equal to 1, 2, or 3 and/or less than 5 or 10. In one example, the return limit is 1 or 2.

At process block 82, the voltage increment ($V_i$) is determined. As noted above, the voltage increment ($V_i$) during the first set of one or more preliminary oxide formation operations is 0.0 V. The voltage increment can be a constant or can be function of the difference between the measured capacitance and the capacitance threshold. The value of the voltage increment can be increased in response to increases in the difference between the measured capacitance and the capacitance threshold. As an example, when the value of the measured capacitance minus the capacitance threshold is greater than or equal to 0 µF and less than 10 µF, the value of the voltage increment can be 10V; when the value of the measured capacitance minus the capacitance threshold is greater than or equal to 10 µF and less than 20 µF, the value of the voltage increment can be 15V; and when the value of the measured capacitance minus the capacitance threshold is greater than or equal to 20 µF the value of the voltage increment can be 20V. While this illustration of the voltage increment as a function of the difference between the measured capacitance and the capacitance threshold shows a step-wise functionality, other functionalities are possible. For instance, the voltage increment can be selected using a mathematical relationship that expresses the voltage increment as a function of the difference between the measured capacitance and the capacitance threshold. Examples of suitable voltage increments include, but are not limited to, voltage increments greater than or equal to 0V, or 1V, and/or less than or equal to 30 V. Alternately, the voltage increment can be a function of the number of sets of one or more preliminary oxide formation operations has already been performed on the sheet of material (n). For instance, the voltage increment ($V_i$) can be determined from equation 2: $V_i = n * \Delta V$ where $\Delta V$ is a constant.

From process block 82, the process returns to process block 72 where another set of the one or more preliminary oxide formation operations are performed using the voltage increment ($V_i$) determined at process block 82 in Equation 1 to determine the target voltage for each of the one or more preliminary oxide formation operations in the set. As a result, each time the sheet of material is returned to process block 72, all or a portion of the one or more preliminary oxide formation operations performed at process block 72 are performed at an increased target voltage relative to the prior set of one or more preliminary oxide formation operations. The increased target voltage allows additional oxide to be grown during the first preliminary oxide formation operation in the new set of one or more preliminary oxide formation operations.

The number and/or electrical treatment in the set of one or more preliminary oxide formation operations that are performed each time the sheet of material 48 is returned to process block 72 can be the same or different. In some instances, the set of one or more preliminary oxide formation operations that are performed each time the sheet of material 48 is returned to process block 72 are the same or essentially the same as the last set of one or more preliminary oxide formation operations performed on the sheet of material, with the exception of the target voltage set at process block 82 being different. When the incremental voltage drop is non-zero, a change to the target voltage for the first preliminary oxide formation operation in a set can change the target voltage for all or a portion of the first preliminary oxide formation operations in the set. The one or more preliminary oxide formation operations that are repeated with the same electrical treatment but modified target voltages can serve as modified preliminary oxide formation operations.

The capacitance of the sheet of material drops as the target voltage increases. As a result, the increased target voltage(s) that is used each time another set of preliminary oxide formation steps is performed on the sheet of material decreases the capacitance of the sheet of material. The voltage increment can be selected to bring the capacitance of the sheet of material under the capacitance threshold. For instance, increasing the voltage increment in response to increases in the difference between the measured capacitance and the capacitance threshold increases the odds that the capacitance of the sheet of material will fall below the capacitance threshold after the next set of one or more preliminary oxide formation operations.

In some instances, the sheet of material is not removed from the electrolytic bath between different sets of the one or more preliminary oxide formation operations. In some instances, the sheet of material is not removed from the electrolytic bath between different sets of the one or more preliminary oxide formation operations and also when performing the capacitance testing. As a result, the sheet of material can remain in the same electrolytic bath during each set of the one or more preliminary oxide formation operations and also during the capacitance testing.

At decision block 76, when the one or more capacitance criteria indicate that the sheet of material has an acceptable capacitance, the determination at decision block 76 can be negative and the process can proceed to process block 84. At process block 84, a set of none, one, or more than one secondary oxide formation operation is performed on the sheet of material. Each of the secondary oxide formation operations can be an oxide formation operation disclosed above.

The electronics can apply an electrical treatment that is the same or different to all or a portion of the secondary oxide formation operations. The target voltage for each of the one or more secondary oxide formation operations can again be determined from Equation 3: $V_T = V_b + V_i - V_d$ where the base voltage ($V_b$) has the same value as used in the preliminary oxide formation operations, the voltage increment ($V_i$) is the last value determined at process block 82 or is 0.0 V when the process block did not reach process block 82, and $V_d$ represents the incremental voltage drop and can be the same or different for each of the secondary oxide formation operations.

The value of the incremental voltage drop (Va) can be the same different for all or a portion of the one or more secondary oxide formation operation. As a result, the electronics can apply different electrical treatments to different secondary oxide formation operations. As an example where the electronics apply different electrical treatments to different secondary oxide formation operations, the target voltage of all or a portion of the secondary oxide formation operations is lower than the target voltage of the immediately prior oxide formation operation whether the immediately prior oxide formation operation was a secondary oxide formation operation or a preliminary secondary oxide formation operation. The difference in the target voltage between a secondary oxide formation operation and the immediately prior oxide formation operation can serve as the incremental voltage drop (Va). The incremental voltage drop can be the same or different for each secondary oxide formation operation. In some instances, the incremental voltage drop (Va) for all or a portion of secondary oxide formation operations is greater than or equal to the incremental voltage drop (Va) of the immediately prior oxide formation operation whether the immediately prior oxide formation operation was a secondary oxide formation operation or a preliminary secondary oxide formation operation. In some instances, at least a portion of the incremental voltage drops for each secondary neighboring oxide formation operation is greater than 0.0 V. In some instances, at least a portion of the incremental voltage drops for each secondary neighboring oxide formation operation is equal to 0.0 V. Suitable incremental voltage drops for secondary oxide formation operations include, but are not limited to, incremental voltage drops greater than or equal to 0 V, or 0.5 V and/or less than 2.5 V, or 10 V.

As another example where the electronics apply different electrical treatments to different secondary oxide formation operations in the same set, the desired leakage current for each secondary oxide formation operation performed in the set can be lower than the desired leakage current of the immediately prior oxide formation operation whether the immediately prior oxide formation operation was a preliminary oxide formation operation or a secondary formation operation. The drop in the desired leakage current between oxide formation operations can be a secondary incremental leakage current drop. In some instances, all or a portion of the secondary incremental leakage current drops for each secondary oxide formation operation in a set is 0 V. Suitable values for the secondary incremental leakage current drop include, but are not limited to, incremental leakage current drops greater than or equal to 0.001 Amps and/or less than 0.1 Amps. In some instances, the secondary incremental leakage current drop include, but are not limited to, secondary incremental leakage current drops greater than or equal $4 \times 10^{-3}$ mA/cm$^2$ of apparent surface area and/or less than 0.4 mA/cm$^2$ of apparent surface area. In some instances, one or more sets of the secondary oxide formation operations are configured such that all or a portion of the secondary incremental leakage current drops are non-zero and/or all or a portion of the incremental voltage drops are non-zero.

The process can proceed from process block 84 to process block 86 where a thermal treatment is optionally performed on the sheet of material. The sheet of material is generally removed from the electrolytic bath during the thermal treatment. The process can proceed from process block 86 to branch block 88. The process branches at branch block 88 in response to the number of secondary oxide formation operations that have been performed on the sheet of material. When the process calls for one or more additional secondary oxide formation operations, the process proceeds to process block 84 where another set of the none, one, or more than one secondary oxide formation operation is performed on the sheet of material. In some instances, a thermal treatment is performed such that the heat exposes weaknesses and/or defects in the oxide layer. For instance, the temperature of the heating step may be sufficient to induce defects in the reformed oxide layer. One or more additional secondary oxide formation operations can reform the oxide so as to fully or partially repair the weaknesses and/or defects.

The number of secondary thermal oxide formation operations included in a set and/or the number of thermal treatments can be variable. For instance, if a desired leakage current is not achieved during a secondary thermal oxide formation operation, the secondary thermal oxide formation operation can be terminated and the process can proceed to process block 86 to perform a thermal treatment on the sheet of material.

At branch block 88, when the process does not call for one or more additional secondary oxide formation operations, the process proceeds to process block 90 where the anode metal oxide is formed on the sheet of material and additional processing of the sheet of material is performed. For instance, one or more anode precursors can be extracted from the sheet of material 48 as disclosed above.

The number secondary oxide formation operations in each set of secondary oxide formation operations performed at process block 84 can be the same or different. Additionally, the electrical treatments for different secondary oxide formation operations can be the same or different. The electrical treatments for corresponding secondary oxide formation operations in different sets of secondary oxide formation operations can be the same or different. The set(s) of secondary oxide formation operations and thermal treatments can be configured such that at least one secondary oxide formation operation and at least one thermal treatment is performed on the sheet of material before the metal oxide is fully formed on the sheet of material and the sheet of material is passed to process block 90.

All or a portion of the secondary oxide formation operations can be performed using the same electrolytic bath. Further, all or a portion of the secondary oxide formation operations can be performed using the same electrolytic bath as was used in the preliminary oxide formation operation(s). Alternately, all or a portion of the secondary oxide formation operations can be performed using a different electrolytic bath than was used for the preliminary oxide formation operation(s). In some instances, all or a portion of the secondary oxide formation operations are performed using a different electrolytic bath than was used for the preliminary oxide formation operation(s) but having the same chemical composition as the electrolytic bath used during the preliminary oxide formation operation(s). In some instances, all or a portion of any of the secondary oxide formation operations performed before the first thermal treatment are performed in the same electrolytic bath in which all or a portion of the preliminary oxide formation operations were performed. As a result, the sheet of material need not be removed from the electrolytic bath between the last preliminary oxide formation operation and the first secondary oxide formation operation.

The illustrated process can include other steps that are not illustrated. Additionally or alternatively, the illustrated process can be performed in alternate sequences. For instance, when the number of times that a set of the one or more preliminary oxide formation operations has been performed on the sheet of material is equal to the return limit, the process can proceed from process block 72 to process block 84 without performing the capacitance test at process block 74. Such a modification would effectively remove process block 80 from the process.

Figure 3B:
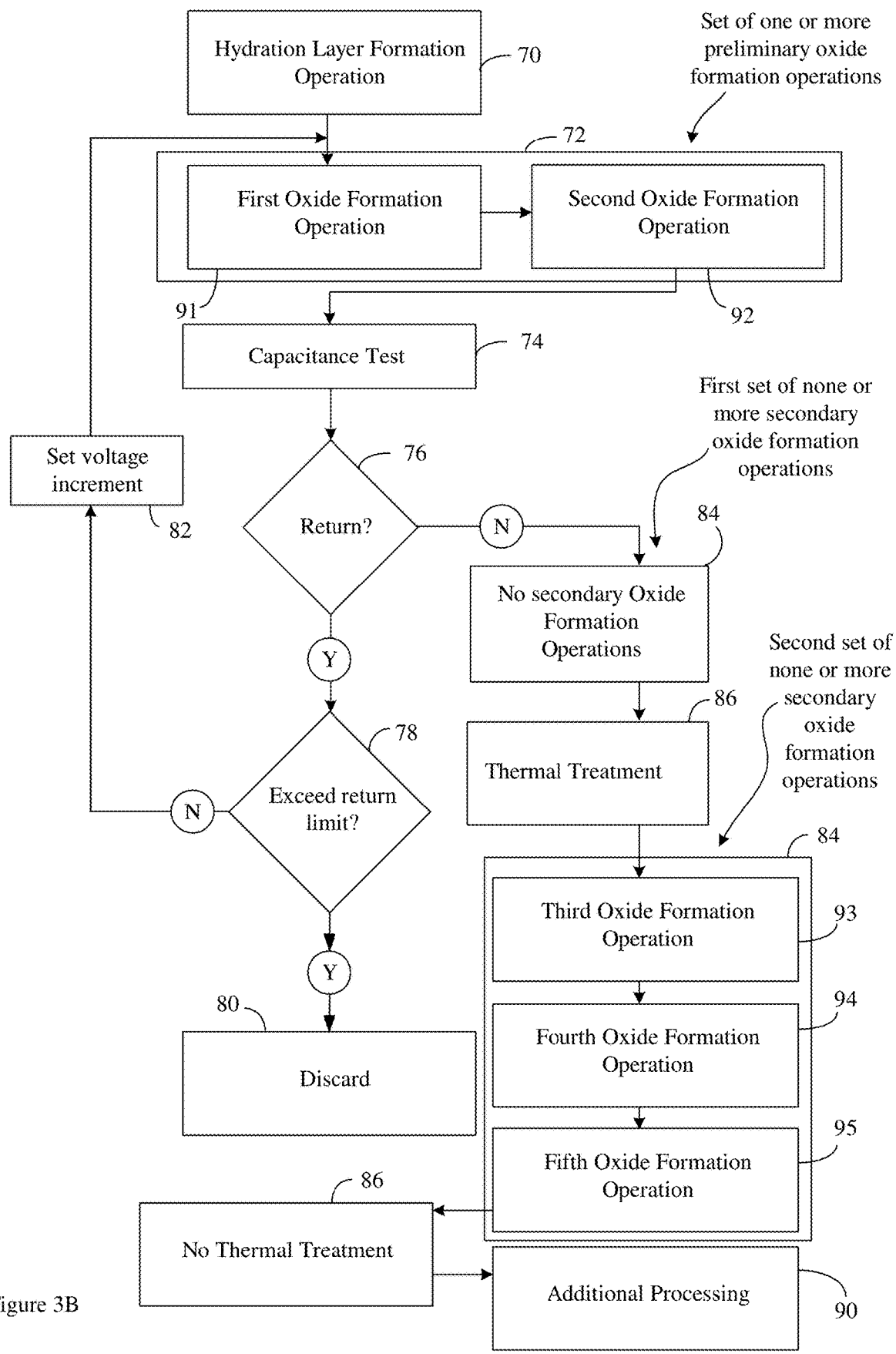
FIG. 3B is an example of the process flow shown in FIG. 3A.

FIG. 3B is an example of the process flow shown in FIG. 3A. The one or more preliminary oxide formation operations shown at process block 72 includes a first oxide formation 91 operation followed by a second oxide formation operation 92. The process is constructed such that the process flows through process block 84 and process block 86 multiple times. The first time that the process reaches process block 84, a secondary oxide formation operation is not performed. Additionally, the first time that process reaches process block 86, a thermal treatment is performed. After the thermal treatment at process block 86, the process proceeds to process block 88 (not shown in FIG. 3B) which returns the process to process block 84 a second time. The second time that the process reaches process block 84, multiple secondary oxide formation operations are performed. Accordingly, the second time that the process reaches process block 84, the second set of none or more secondary oxide formation operations includes a third oxide formation operation 93, a fourth oxide formation operation 94, and a fifth oxide formation operation 95. The second time that process reaches process block 86, a thermal treatment is not performed.

Example 1

Multiple first sheets of material were obtained with widened channels as disclosed in the context of FIG. 2A through FIG. 2E. The first sheets of material were processed as shown in FIG. 3B using a return limit of 1 and a capacitance threshold of 335 µF.

Since the value of the return limit is 1, a portion of the first sheets of material experiences two sets of preliminary oxide formation operations and another portion of the first sheets of material experiences one set of preliminary oxide formation operations. The preliminary oxide formation operations were performed in an electrolytic bath that included a 250 µS conductivity citric acid in deionized water solution.

As shown in FIG. 3B, each set of preliminary oxide formation operations included a first oxide formation operation 91 and a second oxide formation operation 92. During the first oxide formation operation and the second oxide formation operation, the electrolytic bath was a 250 µS conductivity citric acid in deionized water solution at 85° C. During the first oxide formation operation 91, the target voltage was 490 V plus the voltage increment. Additionally, during the first oxide formation operation, the normalized target current was 4 A for 270 cm$^2$ of apparent surface area (~15 mA/cm$^2$) and the desired leakage current was 0.04 A for 270 cm$^2$ of apparent surface area.

During the second oxide formation operation 92, the target voltage was 485 V plus the voltage increment. Additionally, during the second oxide formation operation, the normalized target current was 4 A for 270 cm$^2$ of apparent surface area and the desired leakage current was 0.03 A for 270 cm$^2$ of apparent surface area.

During the first set of preliminary oxide formation operations, the voltage increment was 0.0 V and during the second set of preliminary oxide formation operations, the voltage increment was variable. In particular, when the measured capacitance of a sheet of material was between 335 µF and 345 µF, a voltage increment of 10 V was used. When the measured capacitance of a sheet of material was above 345 µF a voltage increment of 15 V was used.

As shown in FIG. 3B, a thermal treatment was performed after the preliminary oxide formation operations. The thermal treatment was performed by placing a sheet of material in an oven at 500-600° C. for 5 minutes+/−ten minutes.

As shown in FIG. 3B, secondary oxide formation operations were performed after the thermal treatment. The secondary oxide formation operations were performed in an electrolytic bath of 250 µS conductivity citric acid in deionized water solution. The secondary oxide formation operations include a third oxide formation operation, a fourth oxide formation operation, and a fifth oxide formation operation. During the third oxide formation operation, the fourth oxide formation operation, and the fifth oxide formation operation, the electrolytic bath was 250 µS conductivity citric acid in deionized water solution at 85° C. During the third oxide formation operation 93, the target voltage was 482 V, the normalized target current was 4 amps for 270 cm$^2$ apparent surface area, and the desired leakage current was 0.02 A for 270 cm$^2$ of apparent surface area. During the fourth oxide formation operation 94, the target voltage was 482 V, the normalized target current was 4 amps for 270 cm$^2$ apparent surface area, and the desired leakage current was 0.018 A for 270 cm$^2$ of apparent surface area. During the fifth oxide formation operation 95, the target voltage was 482 V, the normalized target current was 4 amps for 270 cm$^2$ apparent surface area, and the desired leakage current was 0.018 A for 270 cm$^2$ of apparent surface area.

Figure 5A:
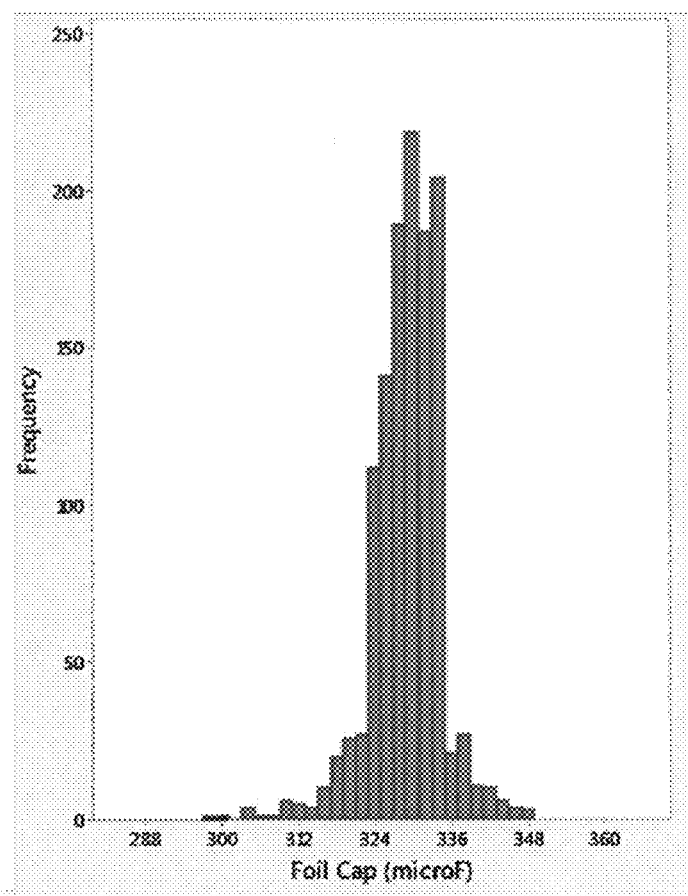
FIG. 5A illustrates the number of sheets of material versus capacitance for sheets of material fabricated with repeated oxide formation operations.
Figure 5B:
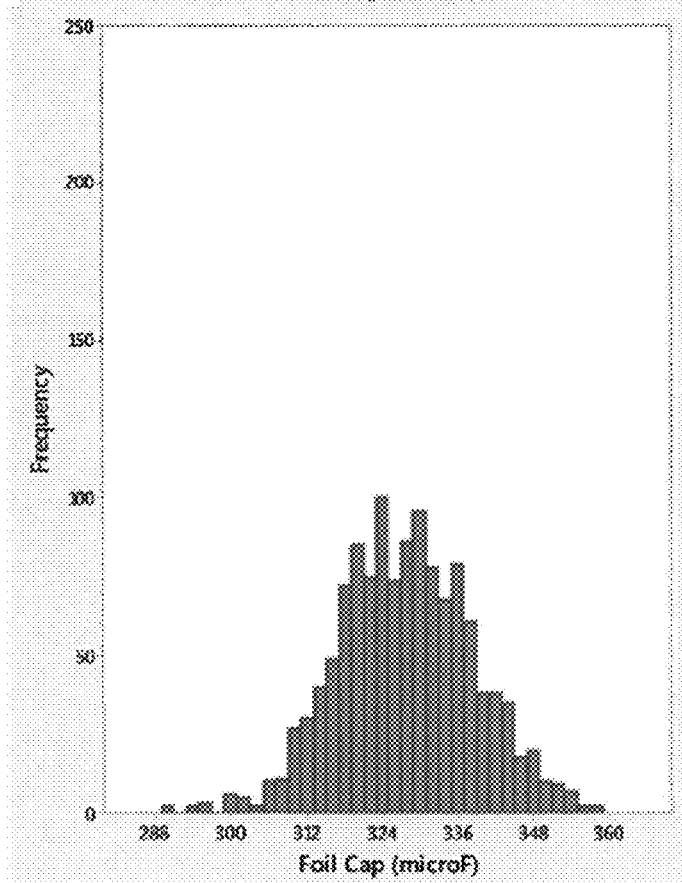
FIG. 5B illustrates the number of sheets of material versus capacitance for sheets of material fabricated without repeated oxide formation operations.

After the fifth oxide formation operation, the capacitances of the first sheets of material were measured. The results are shown in FIG. 5A. The first sheets had an average capacitance of about 300 µF (target capacitance) with a standard deviation of 1.7%. Second sheets were prepared as described above but with a return limit of 0. As a result, none of the second sheets were returned for a second set of the preliminary oxidation formation operations. The capacitance of the second sheets of material were measured and the results shown in FIG. 5B. The second sheets had an average capacitance of about 300 µF (target capacitance) with a standard deviation of 3.3%. Accordingly, returning a portion of the sheets of material for a second set of the preliminary oxidation formation operations at a higher voltage decreased the standard deviation of the results by around 48% and can provide standard deviations less than 2.0% or even less than 1.8%.

Since large portions of the anode oxide formation process can be performed in the same electrolytic bath, large portions of the processes shown in FIG. 3A and FIG. 3B can be controlled by electronics. For instance, the electronics can perform all or a portion of the operations selected from the group consisting of: applying the electrical treatments associated with the preliminary oxide formation operations at process block 72, performing the capacitance test at process block 74, determining whether to return a sheet of material for additional preliminary oxide formation operations at decision block 76, determining whether returning a sheet of material for additional preliminary oxide formation operations would exceed the return limit at branch block 78, setting the target voltage at process block 80, and applying the electrical treatments associated with the modified preliminary oxide formation operations at process block 72.

Additional guidance for capacitor fabrication can be found in U.S. patent application Ser. No. 15/996,219, filed on Jun. 1, 2018, and incorporated herein in its entirety. The additional guidance includes but is not limited to guidance for performing one or more operations selected form the group consisting of: surface area enhancement phase, extraction of one or more anode precursors from a sheet of material, hydration layer formation, oxide formation operations, and thermal treatments can be found in U.S. patent application Ser. No. 15/996,219, filed on Jun. 1, 2018, and incorporated herein in its entirety.

Figure 4:
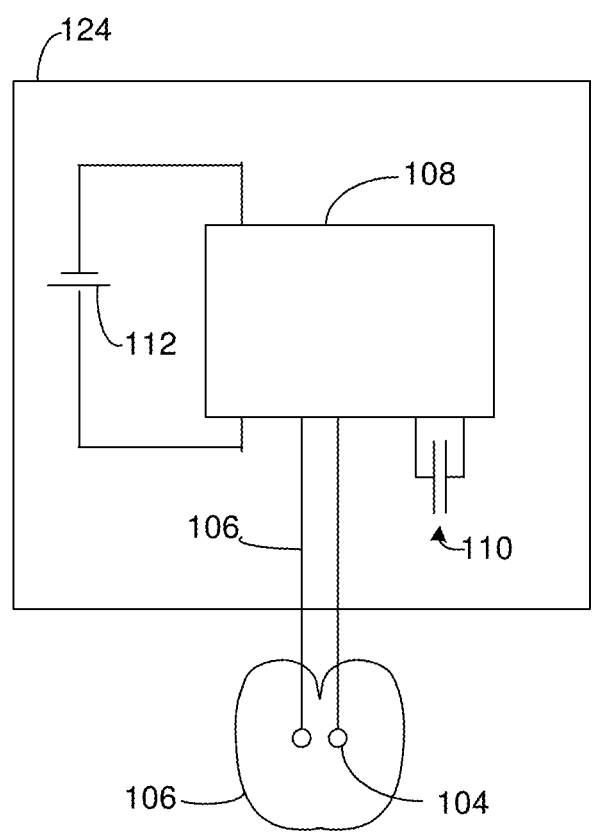
FIG. 4 is a schematic diagram of a defibrillation system that includes an Implantable Cardioverter Defibrillator (ICD) that employs one or more capacitors.

FIG. 4 is a schematic diagram of a defibrillation system that includes an Implantable Cardioverter Defibrillator (ICD) that employs one or more capacitors constructed as disclosed above. The defibrillation system includes lead lines 102 connected to electrodes 104 in contact with the heart. Although the defibrillation system is shown with two electrodes 104, the defibrillation system may include three or more electrodes 104 and/or three or more lead lines. The specific positions of the electrodes 104 relative to the heart 106 is dependent upon the requirements of the patient.

The defibrillation system also includes a processing unit 108. The lead lines 102 provide electrical communication between the processing unit 108 and the electrodes 104. The processing unit 108 is also in electrical communication with one or more capacitors constructed as disclosed above.

The processing unit 108 receives power from a battery 112. The processing unit 108 can place the battery 112 in electrical communication with the one or more capacitors 110. For instance, the processing unit 108 can cause the battery 112 to charge the one or more capacitors 110. Additionally, the processing unit 108 can place the one or more capacitors 110 in electrical communication with the lead lines 102. For instance, the processing unit 108 can cause the one or more capacitors to be discharged such that electrical energy stored in the one or more capacitors is delivered to the heart through all or a portion of the electrodes 104. The processing unit 108, the battery 112 and the one or more capacitors 110 are positioned in a case 124.

During operation of the defibrillation system, the defibrillation system employs output from the lead lines 102 to monitor the heart and diagnose when defibrillation shocks should be provided. When the processing unit 108 identifies that defibrillation shocks are needed, the processing unit 108 provides the heart with one or more defibrillation shocks. To provide a defibrillation shock, the processing unit 108 employs energy from the battery 112 to charge the one or more capacitors 110. Once the one or more capacitors are charged, the processing unit 108 causes these capacitors to be discharged such that energy stored in the capacitors is delivered to the heart through all or a portion of the electrodes 104 in the form of defibrillation shocks. During the defibrillation shocks, the defibrillator requires that one or more pulses be delivered from the battery 112 to the one or more capacitors. Each pulse is generally associated with a defibrillation shock. The duration of each pulse is generally about 8 to 12 seconds with the pulses separated by a delay time that is based on how fast the battery charges the capacitor and determining the appropriate point to provide the defibrillation shock.

Suitable electronics 108 can include, but are not limited to, analog electrical circuits, digital electrical circuits, processors, microprocessors, digital signal processors (DSPs), computers, microcomputers, or combinations suitable for performing the monitoring and control functions. In some instances, the electronics 108 has access to a memory that includes instructions to be executed by the electronics 108 during performance of the control and monitoring functions.

The sequence of events disclosed above for forming an anode can be performed in a sequence other than the disclosed sequence. For instance, the oxide phase extraction can be performed on the anode before the capacitor is assembled. As another example, the aging phase can be performed after the testing phase.

Although the above methods of forming an anode have been disclosed in the context of a capacitor, the above oxide phase extraction can also be applied to the fabrication of anodes, cathodes, positive electrodes, and/or negative electrodes in batteries.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method fabricating a capacitor, comprising:
   performing a first set of preliminary oxide formation operations on a set of sheets of material such that the first set of the preliminary oxide formation operations is performed on each of the sheets of material in the set of the sheets of material,
      during each of the preliminary oxide formation operations, an applied voltage being applied to the sheet of material and increased to a target voltage so as to maintain a target current through the sheet of material,
      performing the first set of the preliminary oxide formation operations includes performing a first one of the preliminary oxide formation operations before a second one of the preliminary oxide formation operations,
      the target voltage during the second one of the preliminary oxide formation operations being less than the target voltage during the first one of the preliminary oxide formation operations;
   performing a capacitance test on each of the sheets of material in the set of the sheets of material so as to determine a capacitance of the sheet of material after performing the first set of the preliminary oxide formation operations on each of the sheets of material in the set of the sheets of material,
   the sheets of material including first sheets and second sheets, each of the first sheets providing a first result for the capacitance determined from the capacitance test and each of the second sheets providing a second result for the capacitance determined from the capacitance test;
   processing the first sheets on a first path and the second sheets on a second path,
      the first path includes performing a second set of the preliminary oxide formation operations on each of the first sheets so as to reduce the capacitance of the first sheet of material below the capacitance determined for the sheet of material from the capacitance test,
      performing the second set of the preliminary oxide formation operations includes performing a prior one of the preliminary oxide formation operations before a subsequent one of the preliminary oxide formation operations,
      the target voltage during the subsequent one of the preliminary oxide formation operations being less than the target voltage during the prior one of the preliminary oxide formation operations; and
   the second path excludes performing any of the second preliminary oxide formation operations in the second set of the preliminary oxide formation operations on each of the second sheets of material.

2. The method of claim 1, wherein the target voltage applied to each of the first sheets during at least one of the preliminary oxide formation operations in the second set of preliminary oxide formation operations is higher than each of the target voltages applied to the first sheet during the first set the preliminary oxide formation operations.

3. The method of claim 2, wherein the target voltage applied to each first sheet during the at least one of the preliminary oxide formation operations in the second set of preliminary oxide formation operations is a function of a magnitude of a difference between the capacitance determined for the first sheets from the capacitance test and a capacitance threshold.

4. The method of claim 1, wherein each of the sheets of material on which the second set of the preliminary oxide formation operations is performed has a capacitance above a capacitance threshold before the second set of the preliminary oxide formation operations is performed on the sheet of material, and further comprising:
  performing one or more secondary oxide formation operations on each of the sheets of material after proceeding on either the first path or the second path,
    the capacitance of each of the sheets of material on which the one or more secondary oxide formation operations is performed is below the capacitance threshold before the one or more secondary oxide formation operations is performed on the sheet of material, and
    during each of the secondary oxide formation operations performed on one of the sheets of material, a secondary applied voltage is applied to the sheet of material so to cause a current to flow through the sheet of material.

5. The method of claim 1, further comprising:
  performing a thermal treatment on each of the sheets of material after proceeding on either the first path or the second path.

6. The method of claim 5, wherein each of the sheets of material on which the second set of the preliminary oxide formation operations is performed has a capacitance above a capacitance threshold before the second set of the preliminary oxide formation operations is performed on the sheet of material, and further comprising:
  performing one or more secondary oxide formation operations on each of the sheets of material such that a secondary applied voltage is applied to the sheet of material so to cause a current to flow through the sheet of material,
    the one or more secondary oxide formation operations being performed on each of the sheets of material after the thermal treatment is performed on the sheet of material, and
    the capacitance of each of the sheets of material on which the one or more secondary oxide formation operations is performed is below the capacitance threshold before the one or more secondary oxide formation operations is performed on the sheet of material.

7. The method of claim 1, wherein the first result for the capacitance determined from the capacitance test includes the capacitance determined from the capacitance test being above a capacitance threshold and the second result for the capacitance determined from the capacitance test includes the capacitance determined from the capacitance test being below the capacitance threshold.

8. The method of claim 7, wherein the capacitance threshold is above a desired capacitance for each of the sheets of material.

9. He method of claim 1, wherein each of the preliminary oxide formation operations and the capacitance test performed on each sheet of material are each performed with the sheet of material positioned in a same electrolytic bath.

10. The method of claim 1, wherein the preliminary oxide formation operations performed on one of the sheets of material is performed such that the target voltage decreases sequentially for each of the preliminary oxide formation operations in the first set.

11. The method of claim 1, wherein during each of the preliminary oxide formation operations in each of the first sets, once the applied voltage increases to the target voltage the application of the target voltage is maintained while an electrical current through the sheet of material drops to a target leakage current, and
  the target leakage current decreases sequentially for the preliminary oxide formation operations in each of the first sets.

12. The method of claim 1, wherein each of the sheets of material on which the second set of the preliminary oxide formation operations is performed has a capacitance above a capacitance threshold before the second set of the preliminary oxide formation operations is performed on the sheet of material, and further comprising:
  performing one or more secondary oxide formation operations on each of the sheets of material after proceeding on either the first path or the second path,
    the one or more secondary oxide formation operations performed on each of the sheets of material includes a same number of oxide formation operations as the preliminary oxide formation operations in the first set of preliminary oxide formation operations performed on the sheet of material, and
    the capacitance of each of the sheets of material on which the one or more secondary oxide formation operations is performed is below the capacitance threshold before the one or more secondary oxide formation operations is performed on the sheet of material.

13. The method of claim 12, wherein the one or more secondary oxide formation operations performed on each of the sheets of material are a repeat of the one or more preliminary oxide formation operations in the first set of oxide formation operations performed on the sheet of material but with the one or more secondary oxide formation operations performed on the sheet of material with a higher target voltage than the one or more preliminary oxide formation operations performed on the sheet of material.

14. The method of claim 12, wherein the one or more secondary oxide formation operations performed on each of the sheets of material include the same number of oxide formation operations as the first set of preliminary oxide formation operations performed on the sheet of material such that each of the secondary oxide formation operations performed on the sheet of material corresponds to one of the preliminary oxide formation operations in the first set of preliminary oxide formation operations performed on the sheet of material,
  during each of the secondary oxide formation operations, a second applied voltage is applied to the sheet of material and increased to a second target voltage, and
  the second target voltage during at least one of the secondary oxide formation operations performed on each one of the sheets of material is greater than the target voltage during the corresponding preliminary oxide formation performed on the sheet of material.

15. The method of claim 1, wherein the first path includes performing a second capacitance test on the first sheets after performing the second set of one or more preliminary oxide formation operations on the first sheets and the second path excludes performing the second capacitance test on the second sheets, the second capacitance test being performed so as to determine the capacitance of the first sheets.

16. The method of claim 1, further comprising:
   performing a chemical etch on each of the sheets of material before performing the first set of the preliminary oxide formation operations on the sheet of material; and
   performing an electrochemical etch on the sheets of material after performing the chemical etch on the sheets of material.

17. The method of claim 16, further comprising:
   extracting an electrode from each of the sheets of material after performing the electrochemical etch on the sheet of material.

\* \* \* \* \*